(12) United States Patent
Sato et al.

(10) Patent No.: US 8,119,918 B2
(45) Date of Patent: Feb. 21, 2012

(54) PRINTED CIRCUIT BOARD AND SEMICONDUCTOR PACKAGE

(75) Inventors: Junya Sato, Tokyo (JP); Shinji Watanabe, Tokyo (JP); Nobuhiro Mikami, Tokyo (JP); Atsumasa Sawada, Tokyo (JP)

(73) Assignee: NEC Corporation, Tokyo (JP)

( * ) Notice: Subject to any disclaimer, the term of this patent is extended or adjusted under 35 U.S.C. 154(b) by 987 days.

(21) Appl. No.: 12/066,474

(22) PCT Filed: Sep. 1, 2006

(86) PCT No.: PCT/JP2006/317338
§ 371 (c)(1),
(2), (4) Date: Mar. 11, 2008

(87) PCT Pub. No.: WO2007/032213
PCT Pub. Date: Mar. 22, 2007

(65) Prior Publication Data
US 2009/0266586 A1   Oct. 29, 2009

(30) Foreign Application Priority Data
Sep. 14, 2005   (JP) .................... 2005-267033

(51) Int. Cl.
*H05K 1/11* (2006.01)
(52) U.S. Cl. ........................................ 174/254
(58) Field of Classification Search ............ 174/254, 174/266
See application file for complete search history.

(56) References Cited

U.S. PATENT DOCUMENTS

| | | | | |
|---|---|---|---|---|
| 3,452,149 A * | 6/1969 | Rinaldi | | 174/261 |
| 6,803,528 B1 * | 10/2004 | Koyanagi | | 174/262 |
| 7,319,265 B1 * | 1/2008 | Wang et al. | | 257/673 |
| 2003/0201534 A1 * | 10/2003 | Eichelberger et al. | | 257/737 |
| 2008/0246025 A1 * | 10/2008 | Nomura et al. | | 257/40 |

FOREIGN PATENT DOCUMENTS

| | | |
|---|---|---|
| JP | 2601128 A | 1/1997 |
| JP | 2001-144441 A | 5/2001 |
| JP | 2002-26515 A | 1/2002 |
| JP | 2004-22600 A | 1/2004 |
| JP | 2004-87551 A | 3/2004 |
| JP | 2004-221433 A | 8/2004 |
| JP | 3596476 A | 9/2004 |

\* cited by examiner

*Primary Examiner* — Chau Nguyen
(74) *Attorney, Agent, or Firm* — Sughrue Mion, PLLC

(57) ABSTRACT

An object of the present invention is to prevent occurrence of an electrical fault such as signal disconnection due to exfoliation between a via and a printed circuit board, via crack, or the like, caused by various stresses that may arise when the printed circuit board is curved. The printed circuit board includes a first wiring layer 11, an electrical insulating base material 12 formed on the first wiring layer 11 and including a via base hole 12a that leads to the first wiring layer 11, and a second wiring layer 16 that is formed on the electrical insulating base material 12 and is electrically connected to the first wiring layer 11 through the via base hole 12a. In a region of the second wiring layer 16 disposed at least in the vicinity of the via base hole 12a, a stress relieving portion 17 is formed which relieves bending stress, tensile stress, compressive stress, and shear stress that may arise when the electrical insulating base material 12 is curved.

17 Claims, 29 Drawing Sheets

FIG. 1A
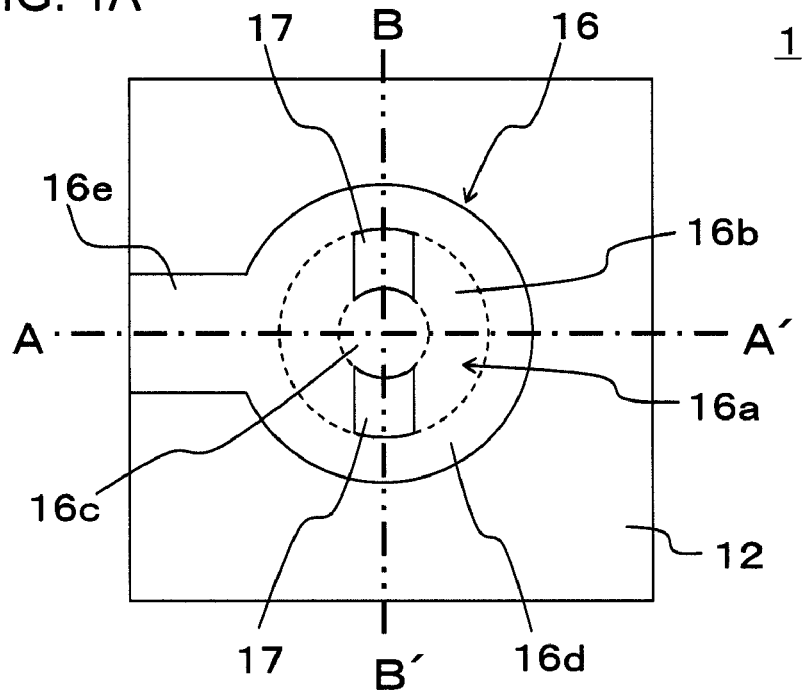
FIG. 1B A-A'
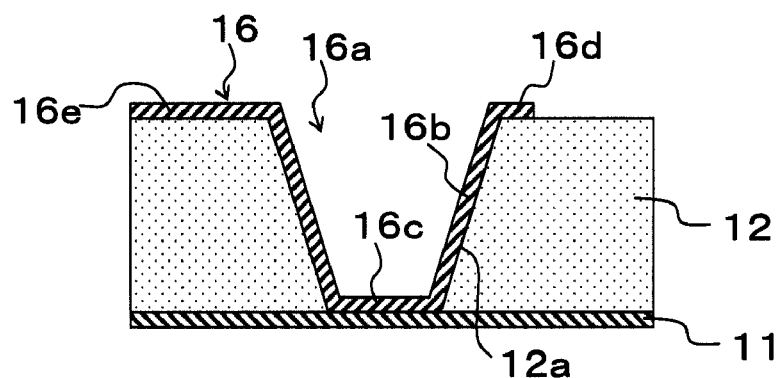
FIG. 1C B-B'
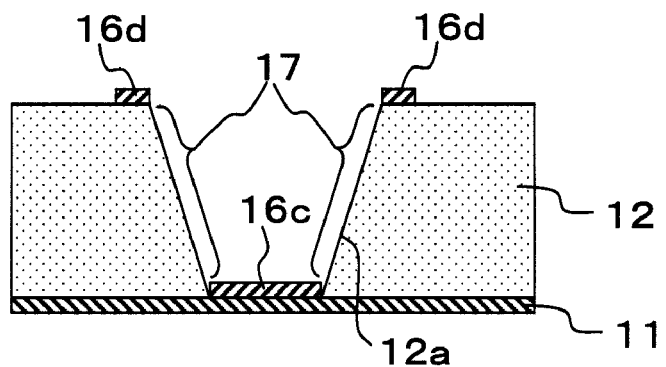

FIG. 3 (EXAMPLE 1-3)
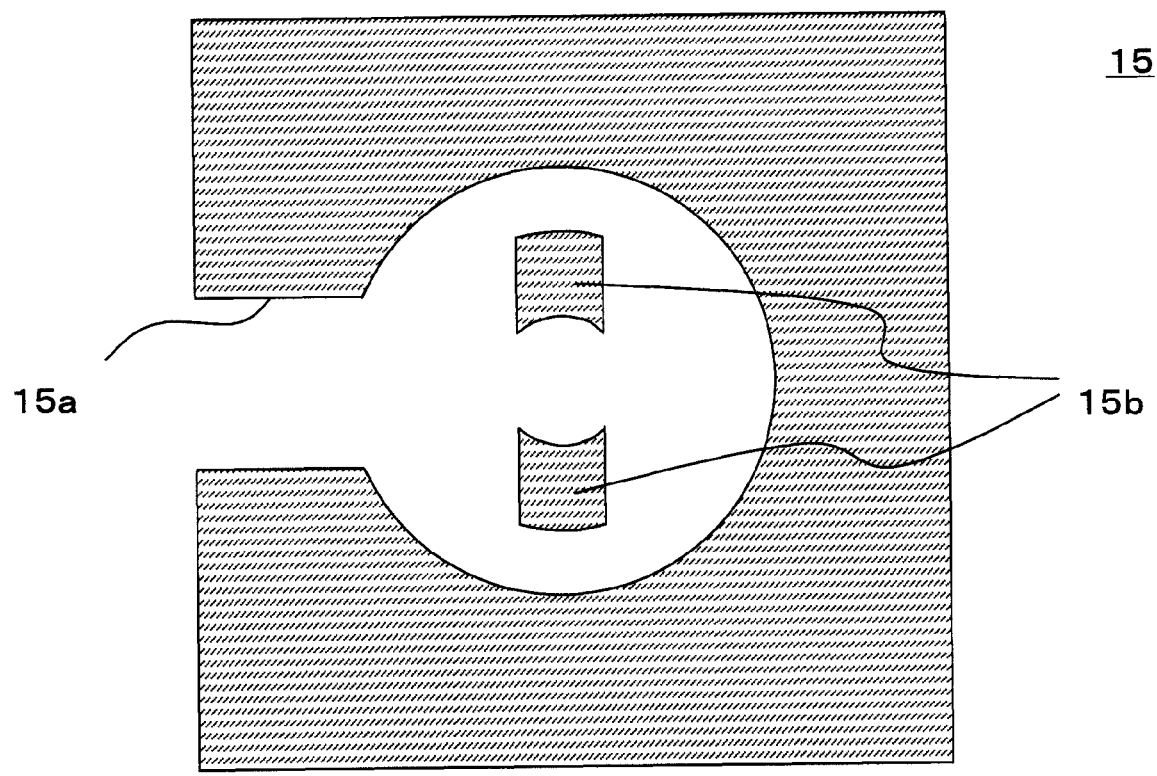

FIG. 4A
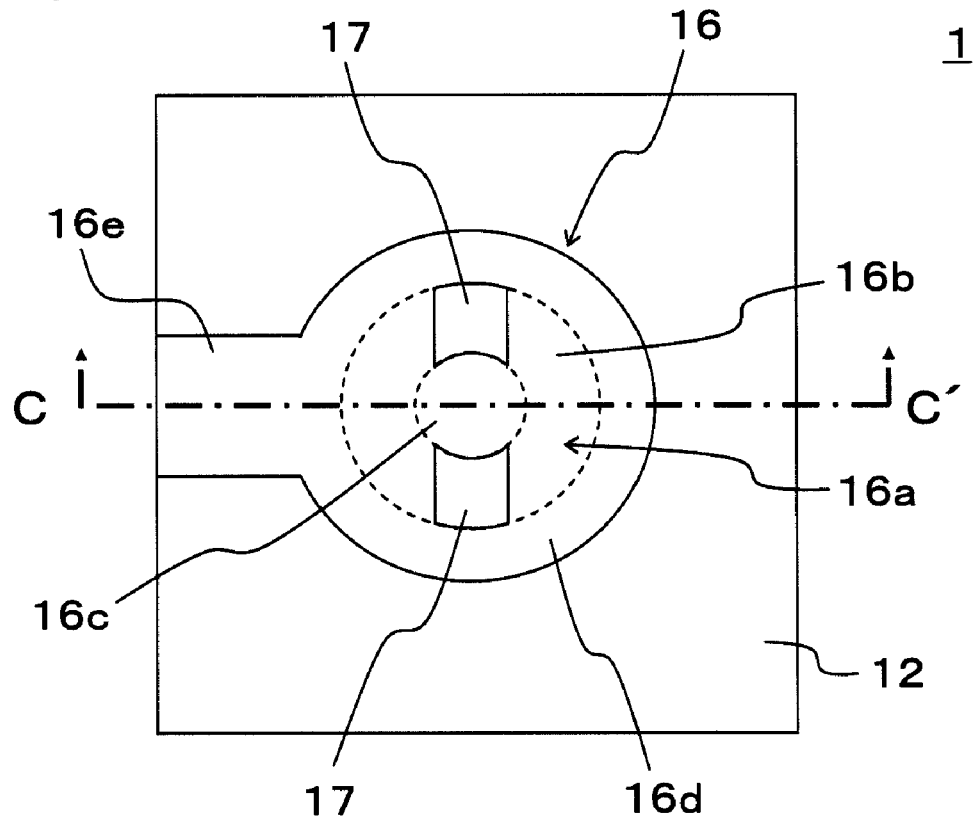
FIG. 4B  c-c'
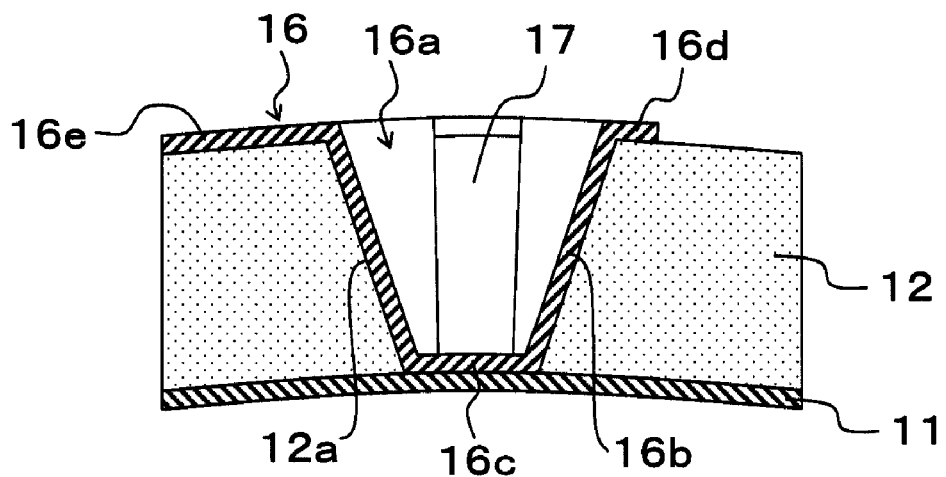

FIG. 5A
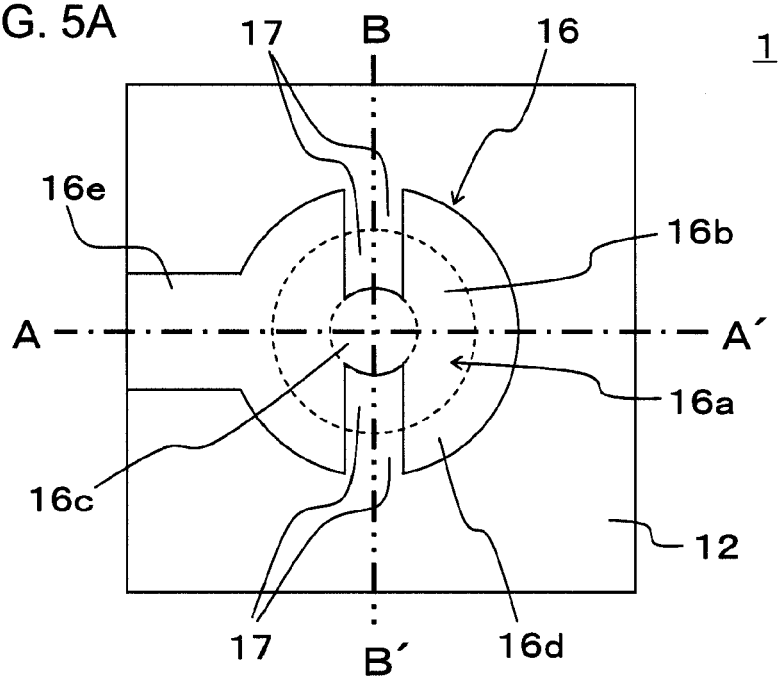
FIG. 5B  A–A'
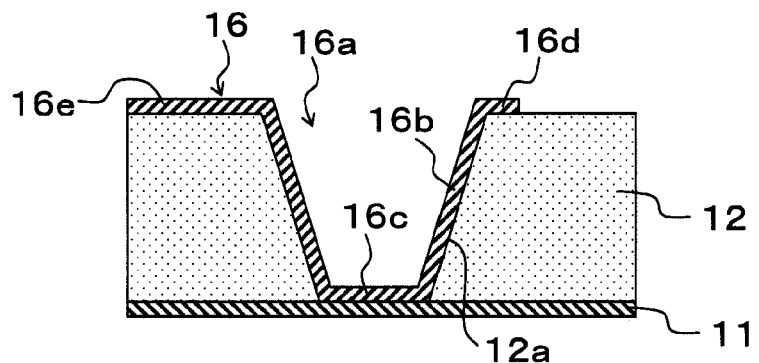
FIG. 5C  B–B'
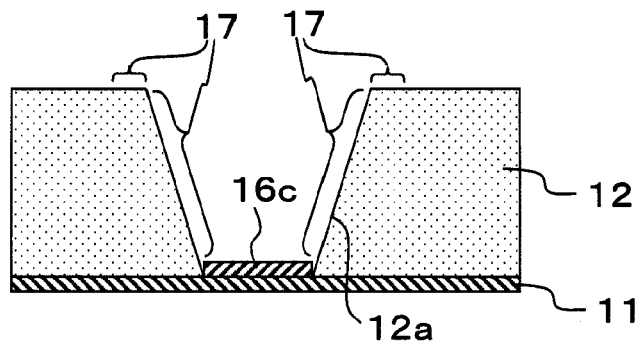

FIG. 6A
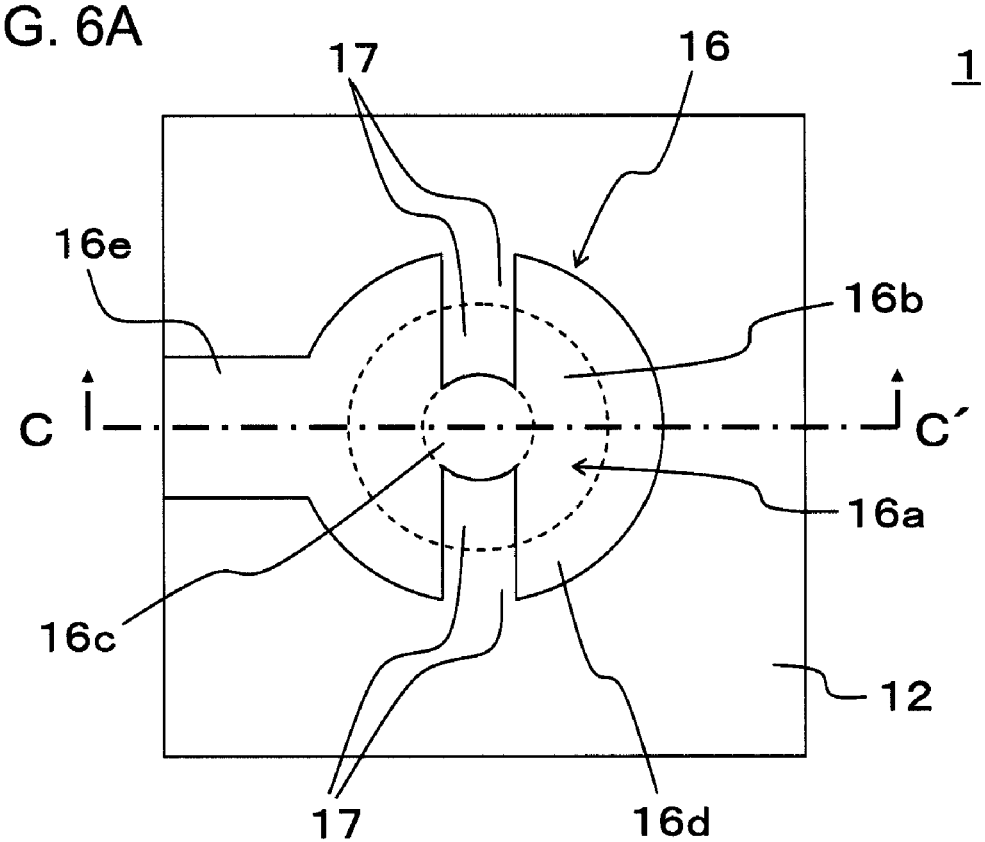
FIG. 6B  C-C'
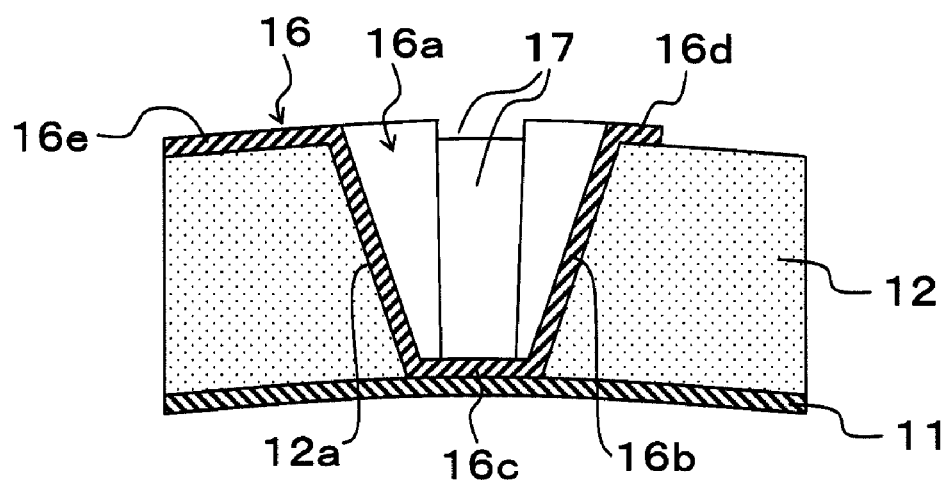

FIG. 7A
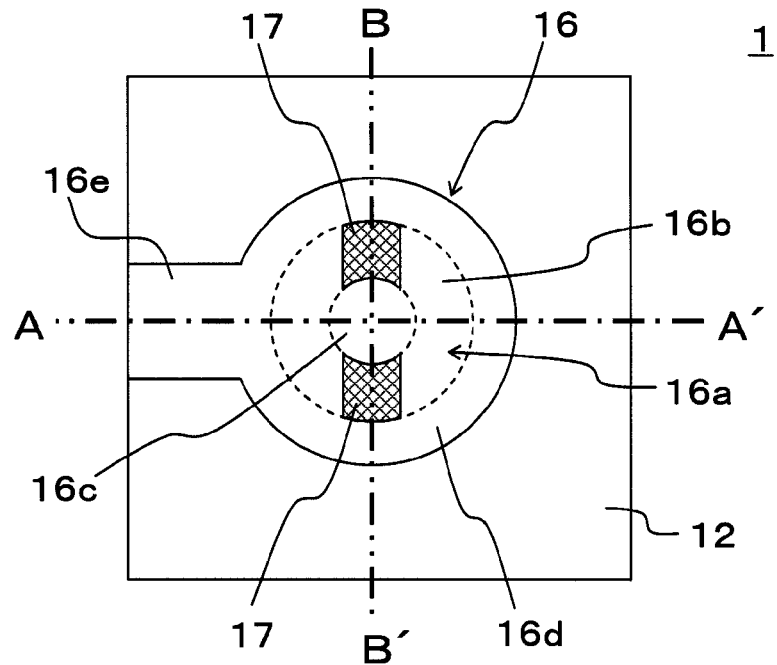
FIG. 7B A-A'
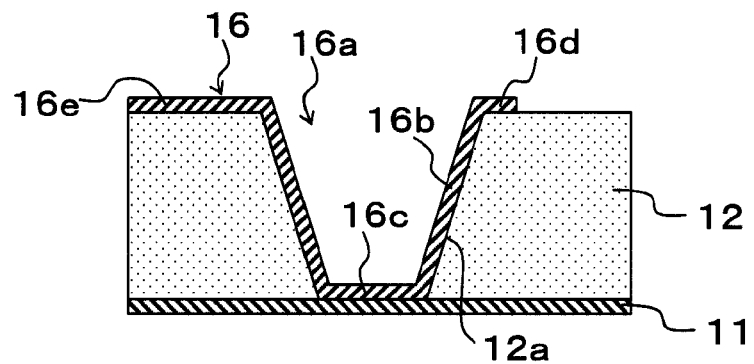
FIG. 7C B-B'
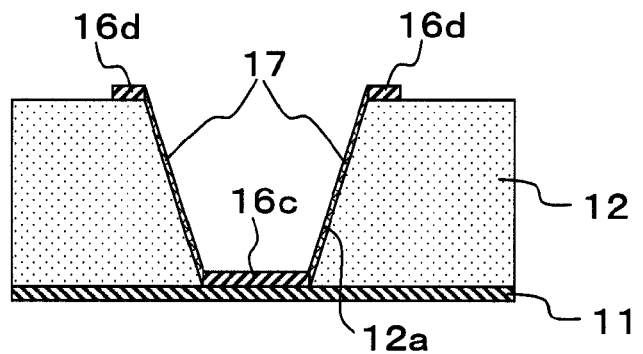

FIG. 8A
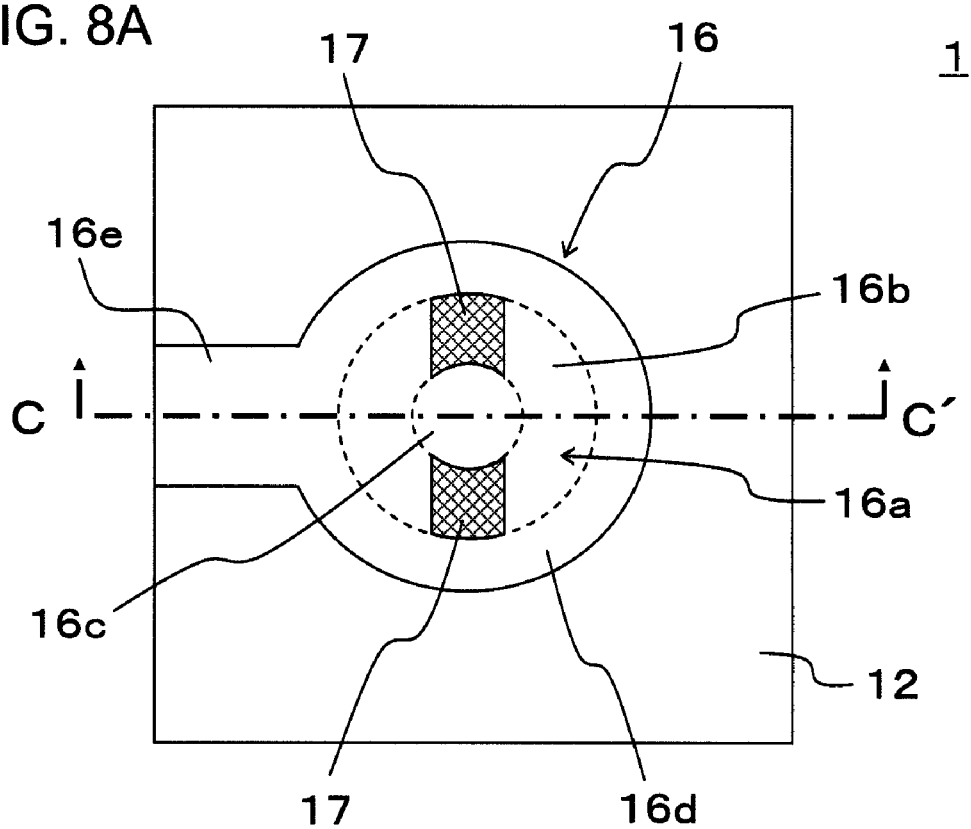
FIG. 8B  C-C'
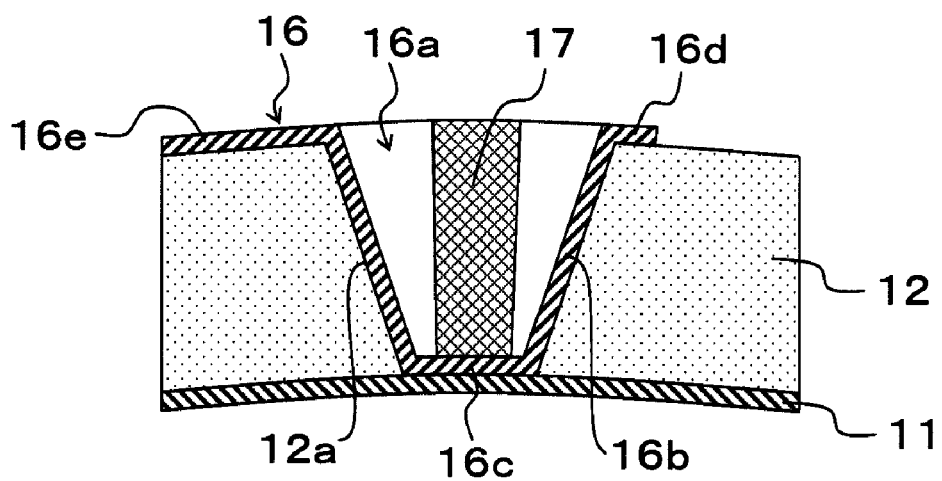

FIG. 9A
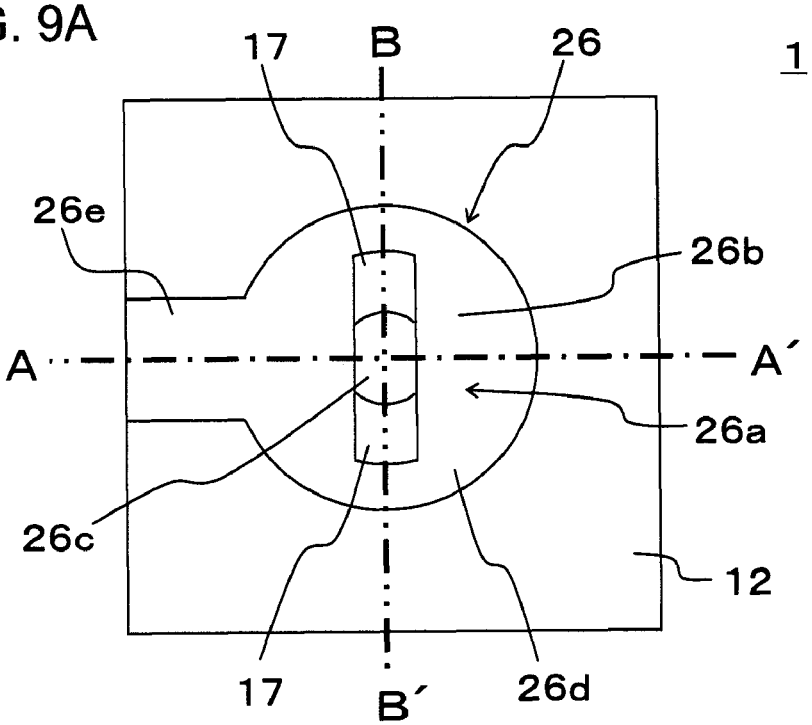
FIG. 9B A-A'
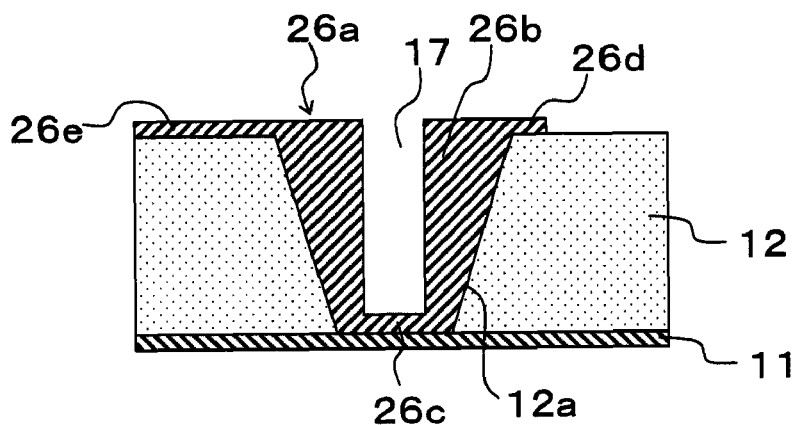
FIG. 9C B-B'
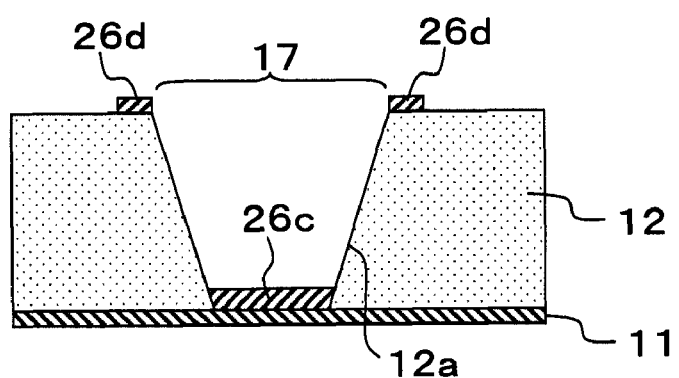

FIG. 12A
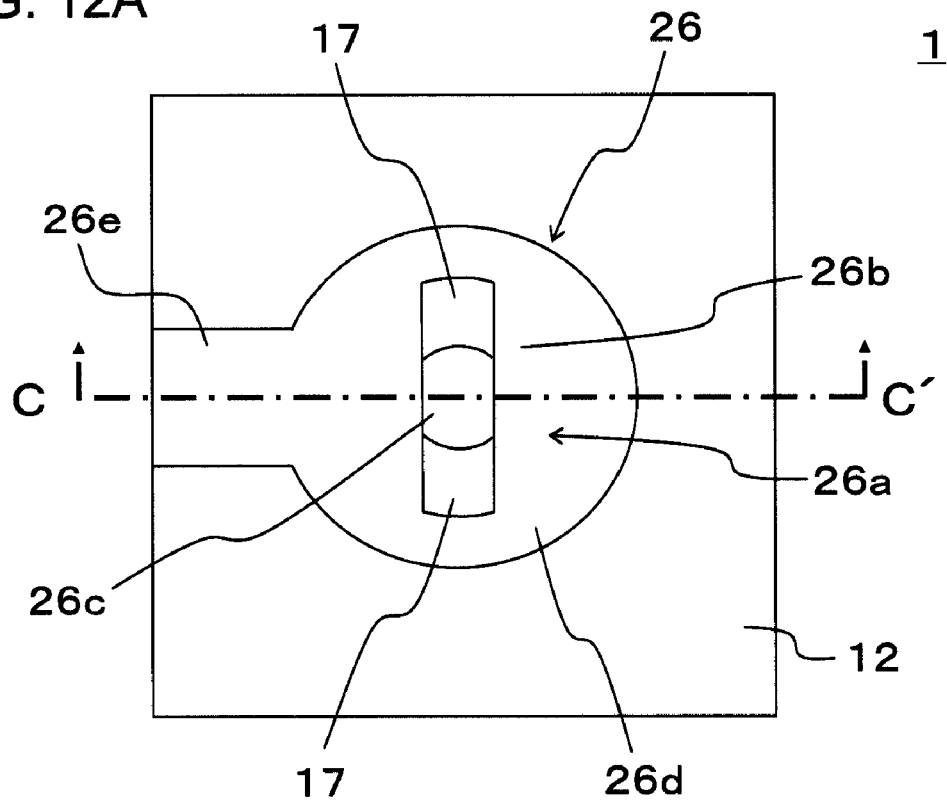
FIG. 12B  C-C'
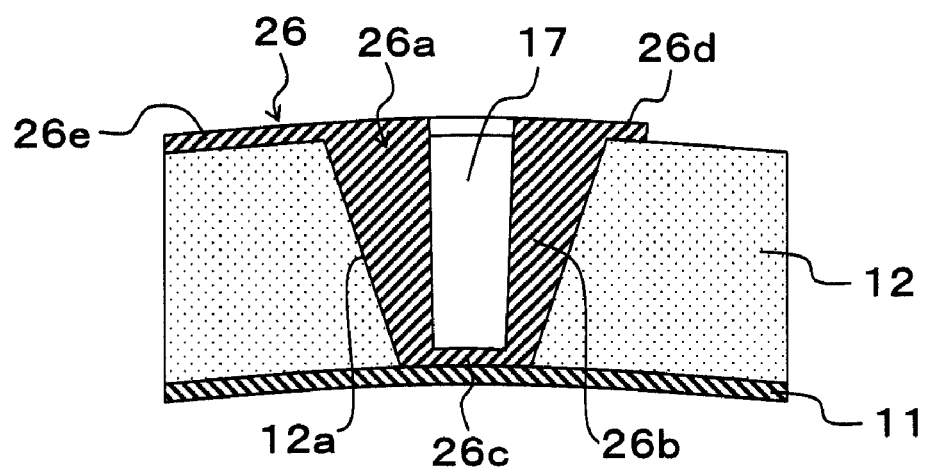

FIG. 14A
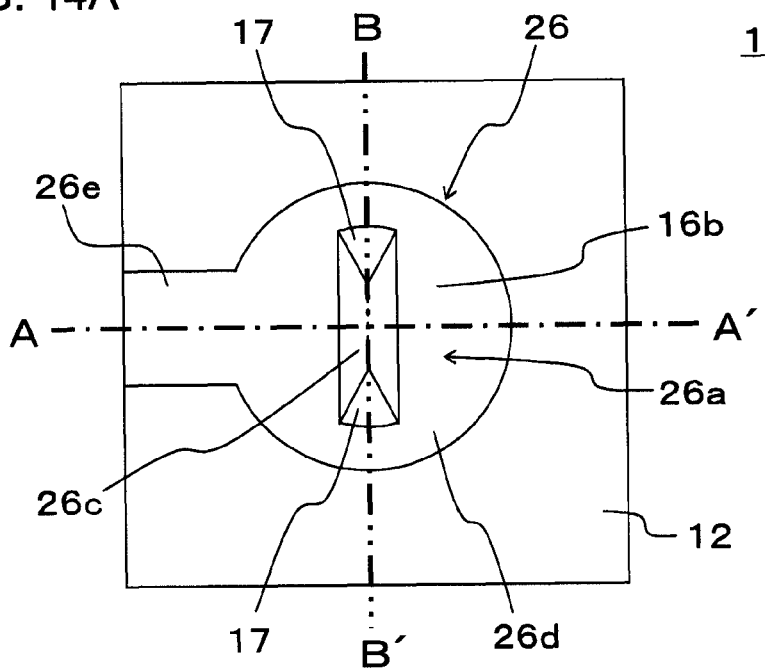
FIG. 14B  A-A'
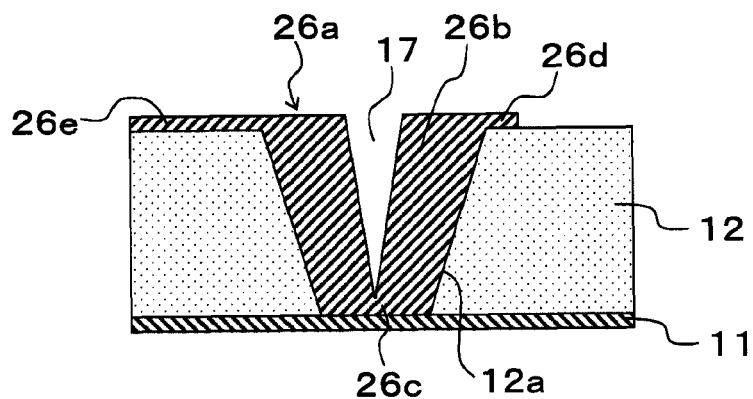
FIG. 14C  B-B'
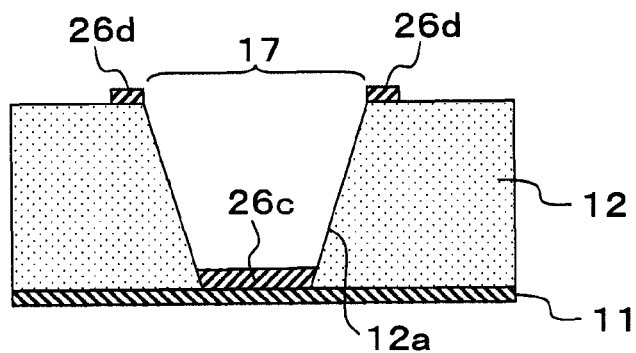

FIG. 15A
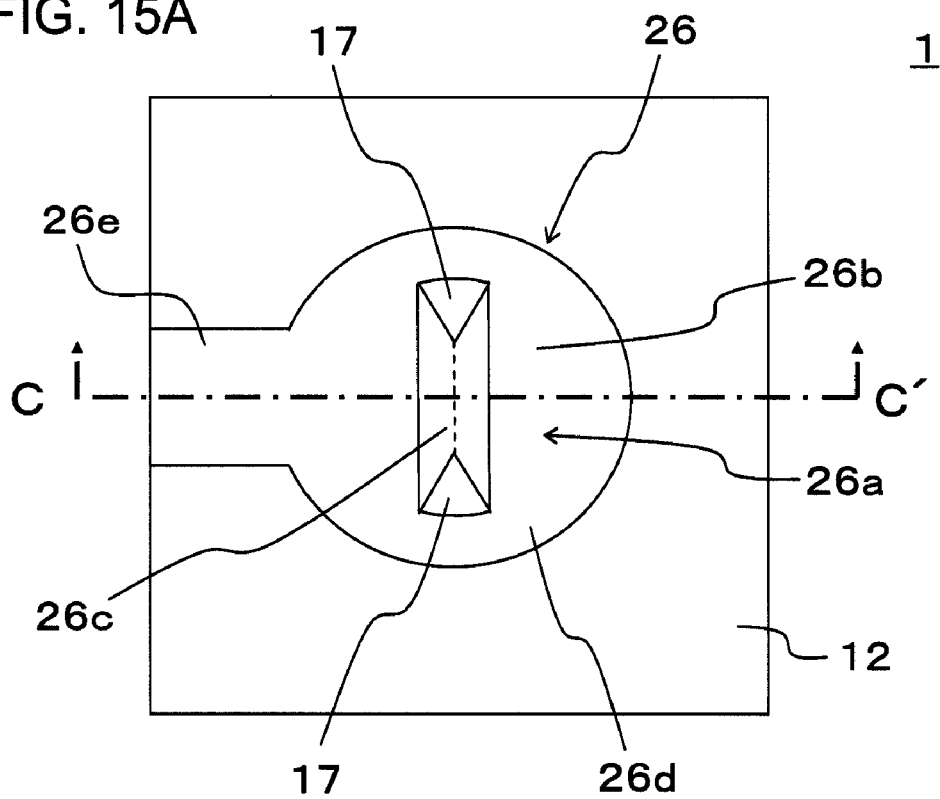
FIG. 15B  C-C'
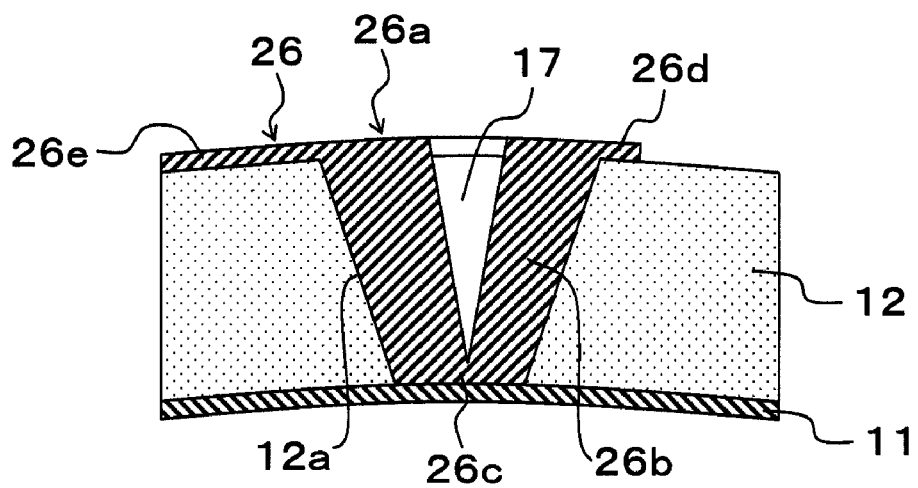

FIG. 16A
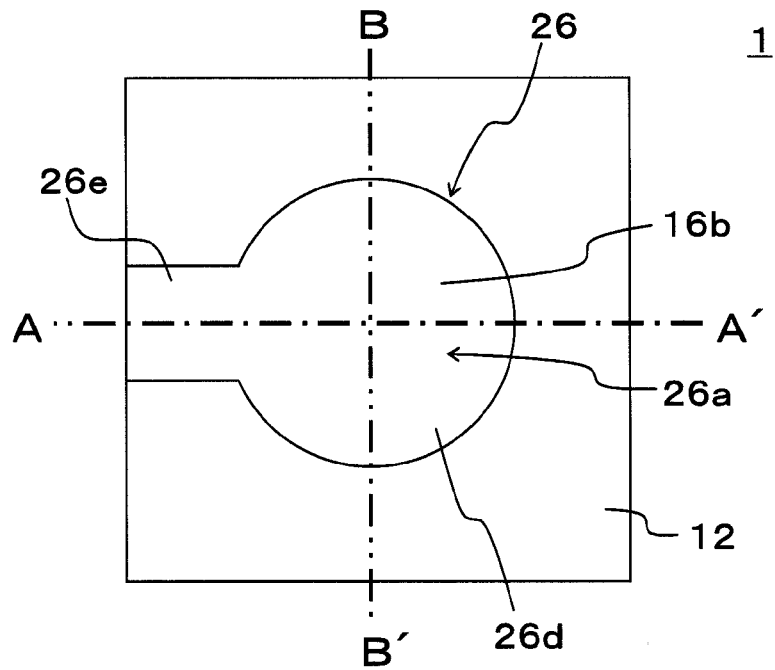
FIG. 16B  A-A'
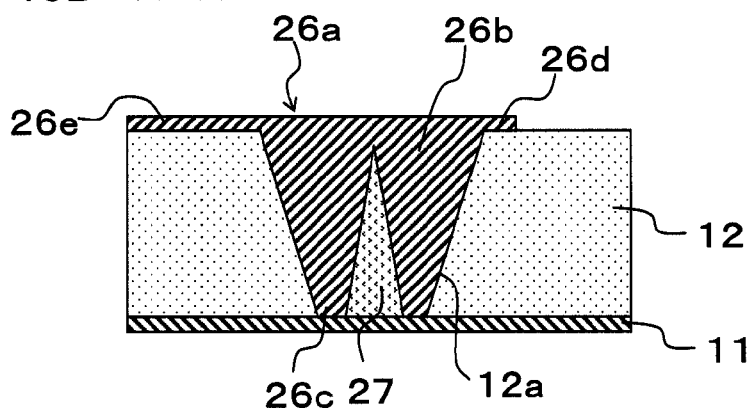
FIG. 16C  B-B'
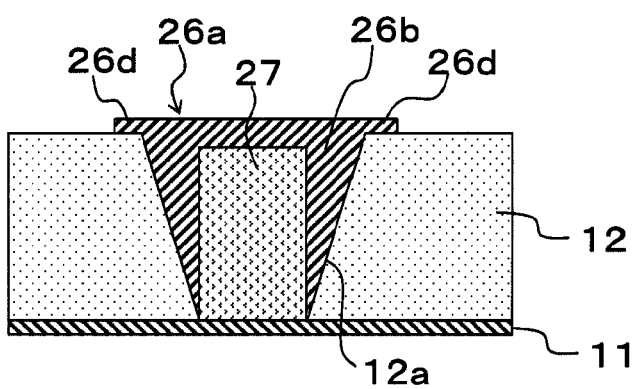

FIG. 18A
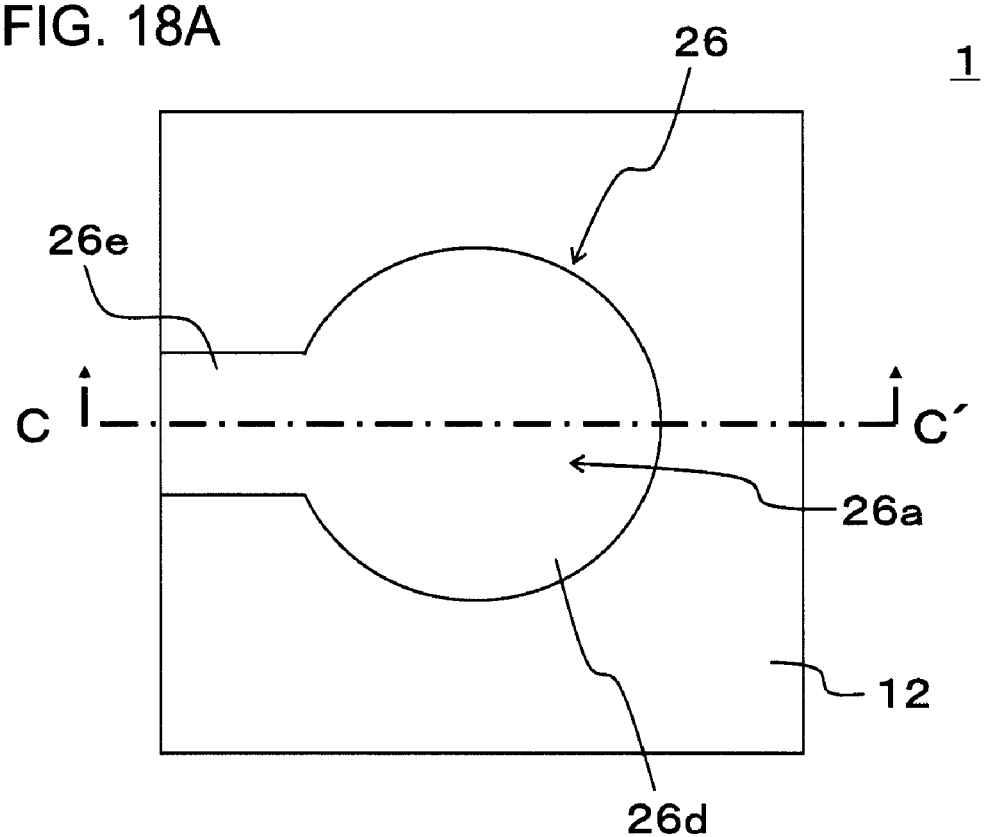
FIG. 18B  c-c'
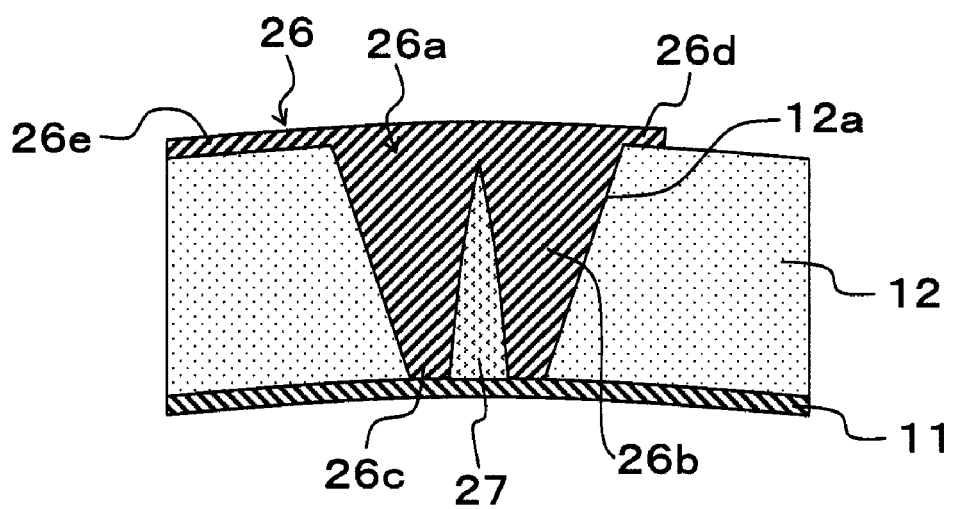

FIG. 19A
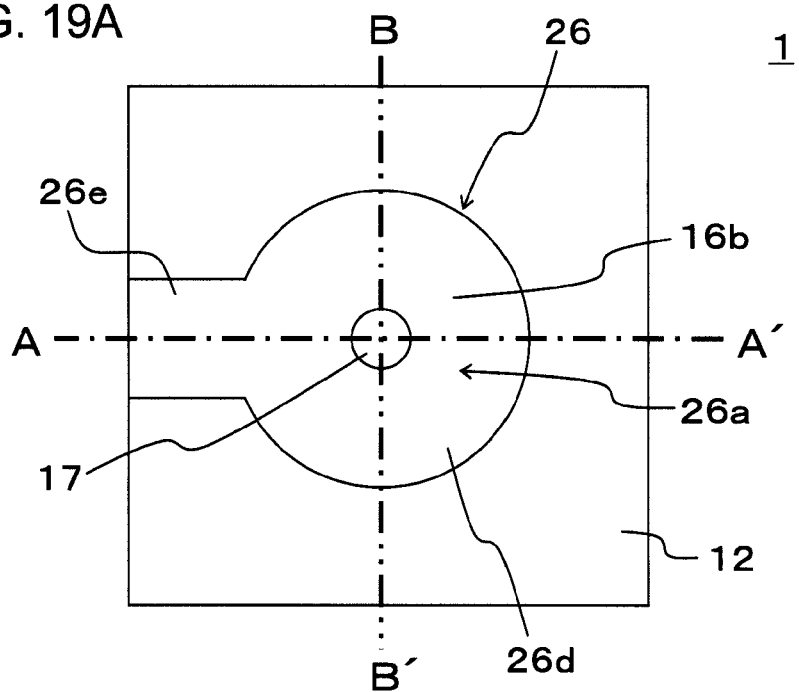
FIG. 19B  A-A'
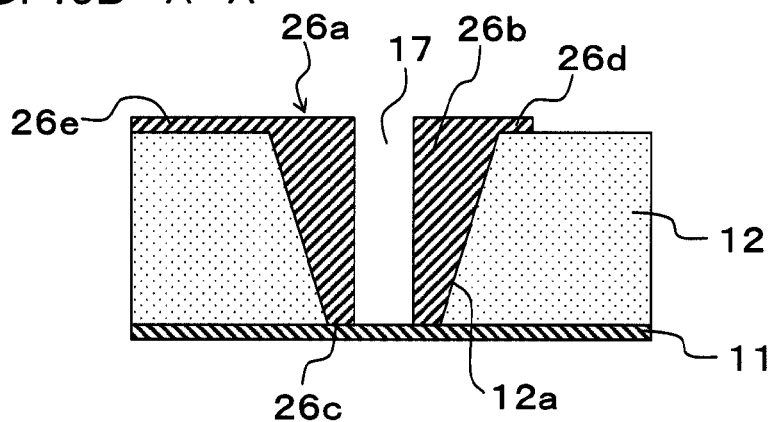
FIG. 19C  B-B'
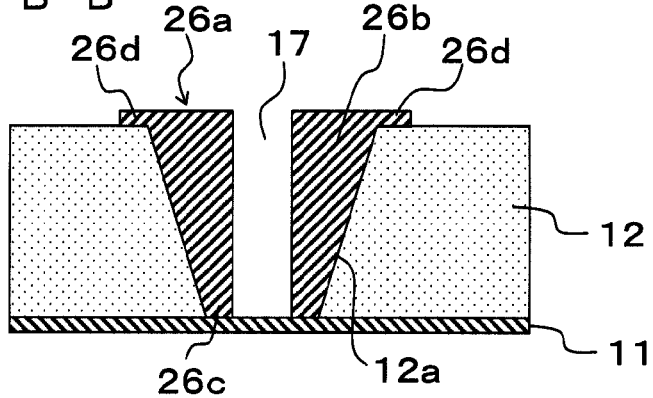

FIG. 20A
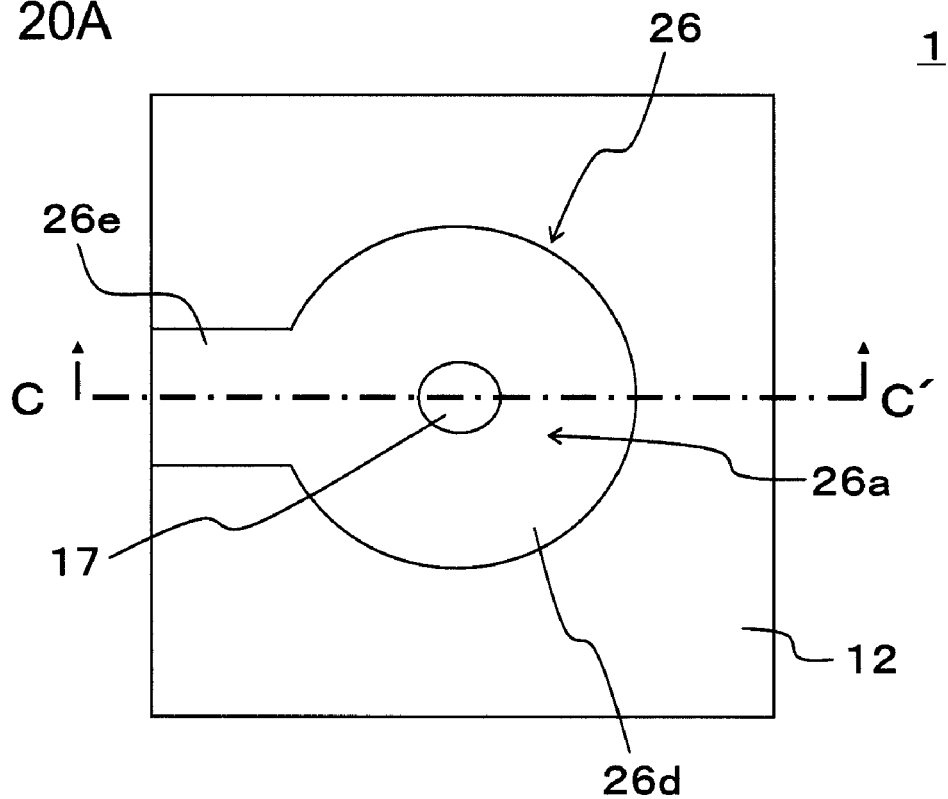
FIG. 20B  C-C'
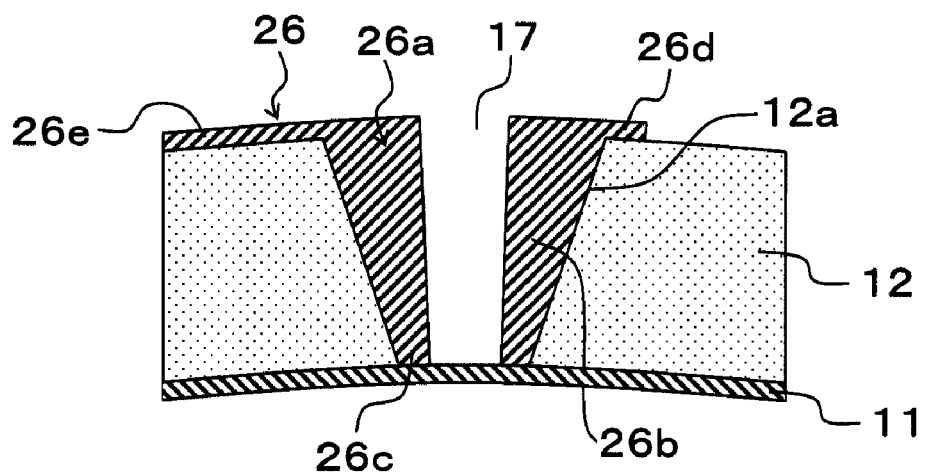

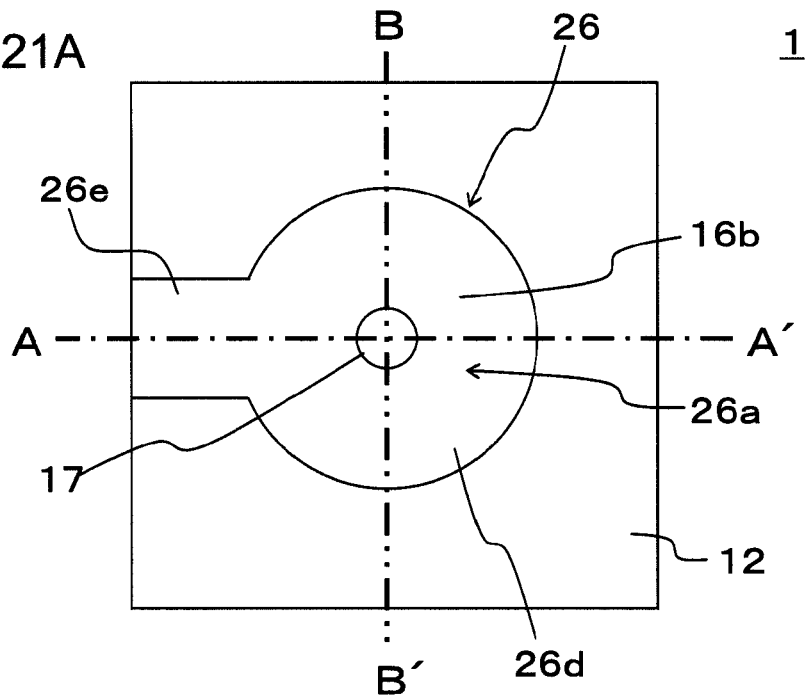
FIG. 21A
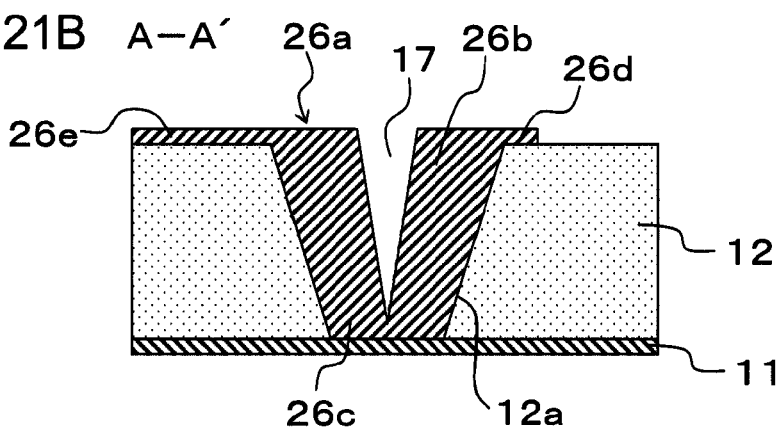
FIG. 21B  A-A'
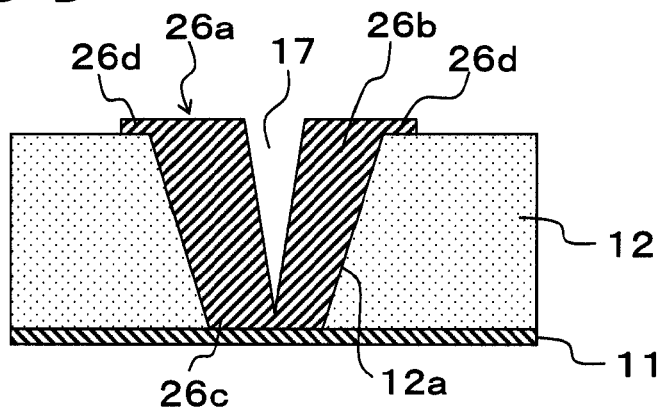
FIG. 21C  B-B'

FIG. 22A
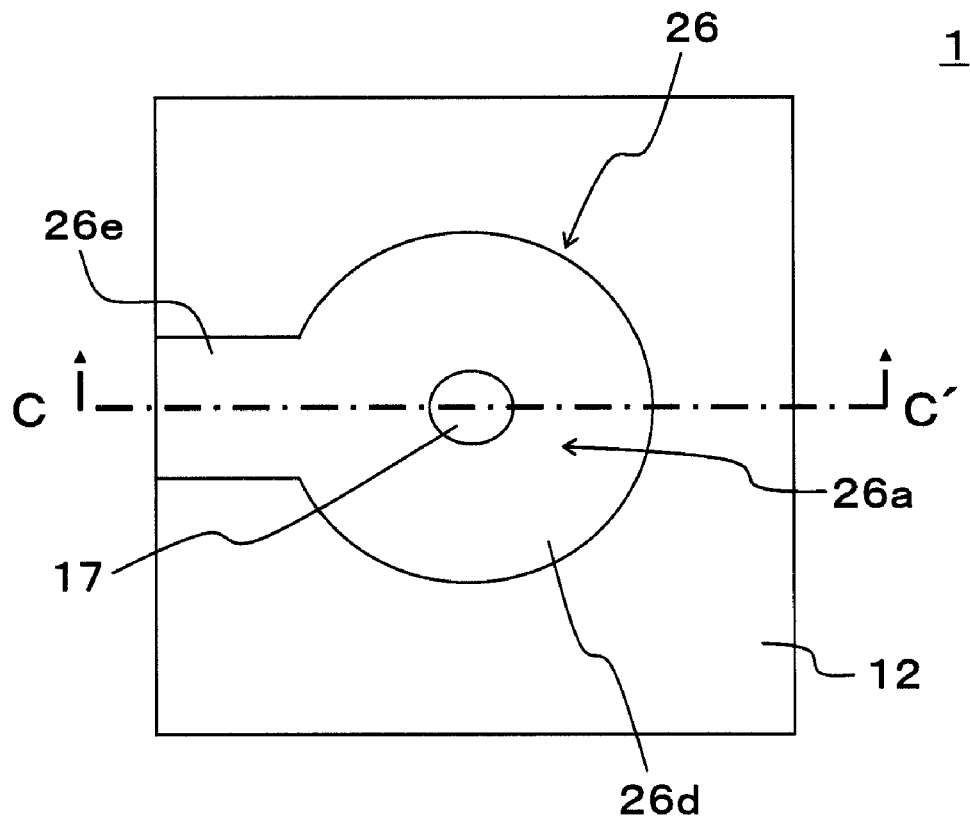
FIG. 22B  C-C'
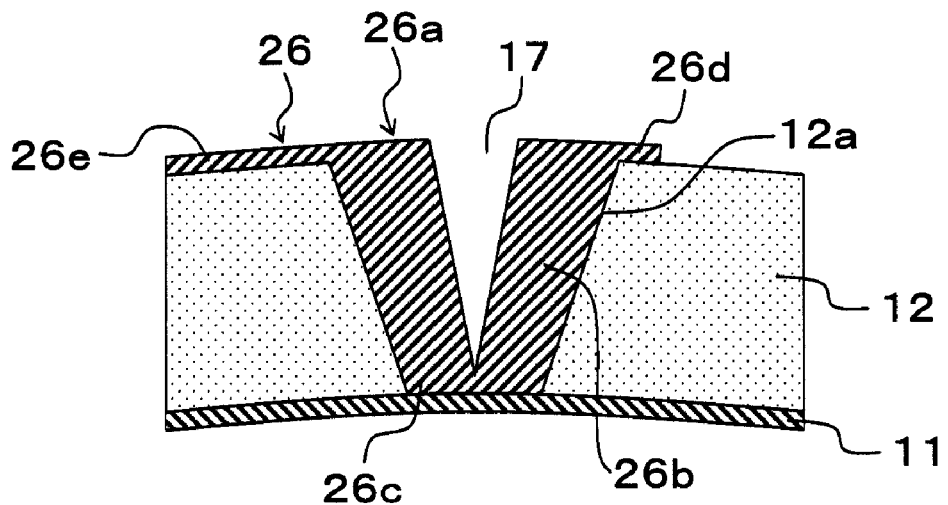

FIG. 23A
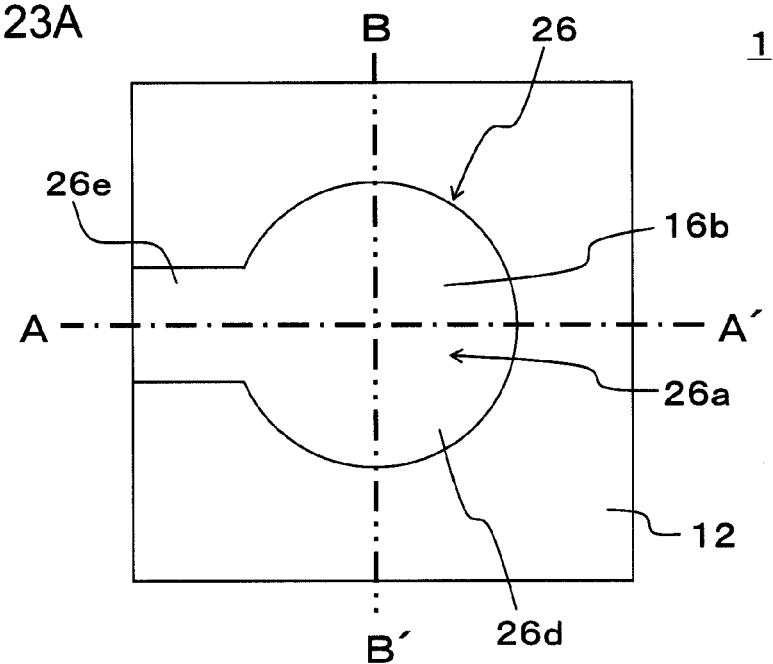
FIG. 23B  A-A'
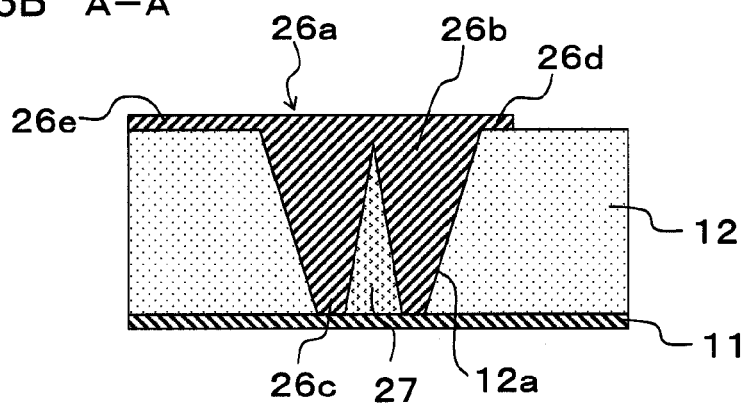
FIG. 23C  B-B'
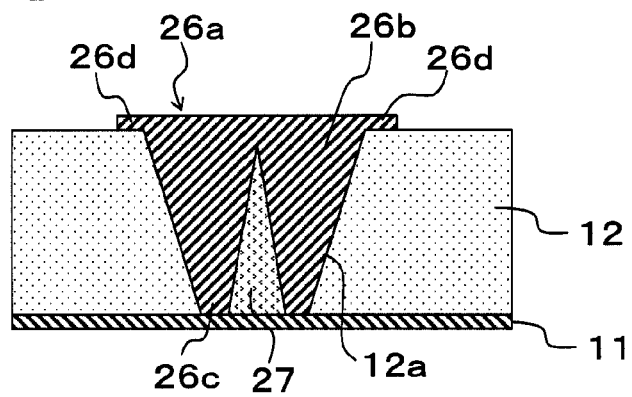

FIG. 24A
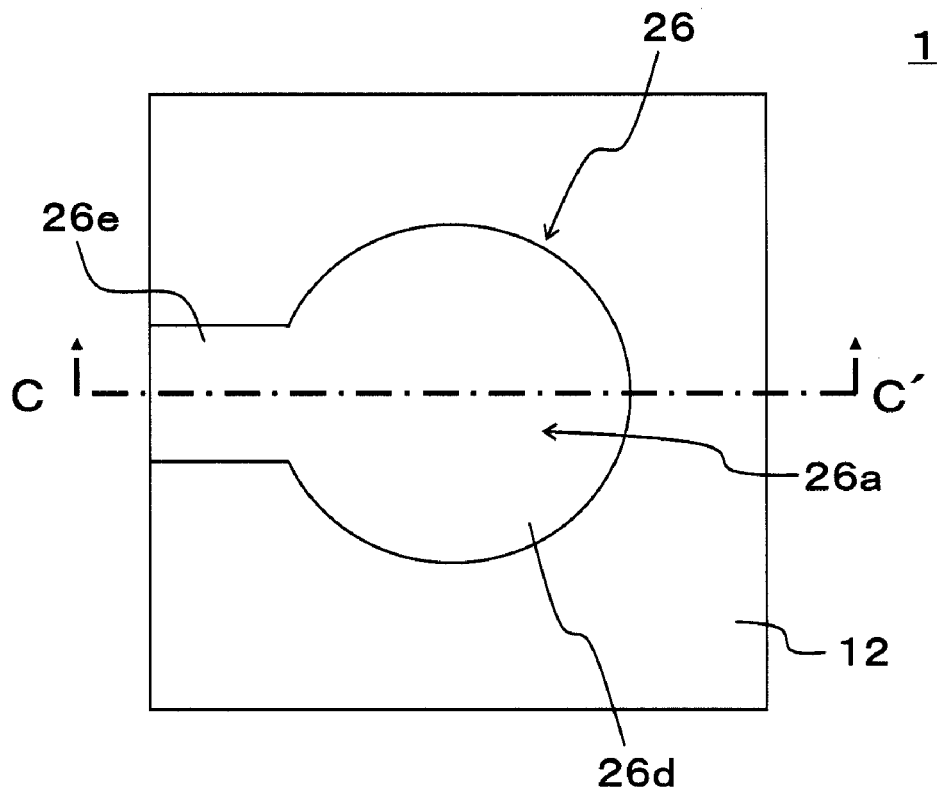
FIG. 24B  C-C'
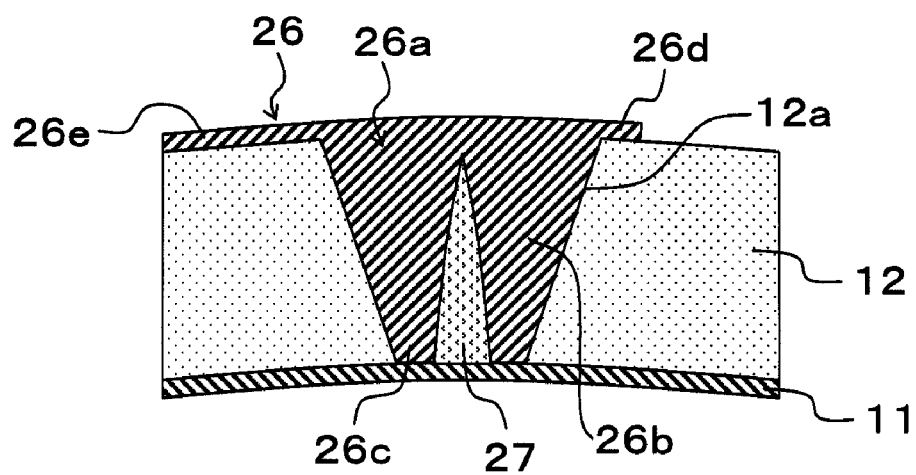

(RELATED ART 1)

PRINTED CIRCUIT BOARD AND SEMICONDUCTOR PACKAGE

TECHNICAL FIELD

The present invention relates to a printed circuit (wiring) board including vias for electrically connecting a plurality of wiring layers, and a semiconductor package. More specifically, the invention relates to a printed circuit board having a structure that relieves stresses which may arise in a discrete via, between the via and an interlayer insulating layer, and between stacked vias, and a semiconductor package.

BACKGROUND ART

Conventionally, cellular phone devices, PDA (Personal Digital Assistant) terminals, or other many electronic devices include a printed circuit board on which a lot of electronic components are mounted in a limited space. With smaller geometries and higher performance of electronic devices, a printed circuit board (especially a multilayer printed circuit board) capable of mounting semiconductor devices such as LSIs at a high density has come to be used. In such a multilayer printed circuit board, an interlayer interconnecting technology capable of establishing electrical connection between wiring patterns of a plurality of layers formed with fine wiring pitches, with high connection reliability, is important. In a via structure used for interlayer connection in the multilayer printed circuit board, in particular, various proposals for achieving smaller geometries and higher reliability have been made.

However, in recent years, ergonomic design targeted for improving outward appearance beauty, operability, and transportability is demanded for the electronic devices. Accordingly, there is an increasing demand for improving a degree of freedom with respect to a shape of the printed circuit board, especially for a curved printed circuit board.

As methods of establishing electrical connection between wiring patterns of a plurality of layers on the conventional printed circuit board, a method (A) of forming a conformal via (hollow via) by applying copper plating along a lower hole for the conformal via and a method (B) of forming a filled via (solid via) by filling an electrically conductive material into a lower hole for the filled via, and the like may be pointed out.

First, as an example of forming the conformal via, there is a method (Related Art 1) disclosed in Patent Document 1, for example. This is a method of forming a via 105 in a base 103 formed of an insulating layer 104 made of a synthetic resin material, as shown in FIG. 26. On both surfaces of the base 103, wiring layers 101 and 102 are formed, respectively. One end of the via 105 opens to one surface of the insulating layer 104 and the other end of the via 105 is closed by the wiring layer 102 on the other surface of the insulating layer 104. By a first plating process, an inside of the via 105, the wiring layer 101 on the other surface exposed within the via 105, and the wiring layer 102 on the one surface of the insulating layer are covered with a plating layer 106. Then, by applying a second plating process, a second plating layer 107 is laminated on the first plating layer 106 within the via 105. Through these plating layers, the wiring layers on both of the surfaces of the insulating layer 104 are electrically connected.

Next, as an example of forming the filled via, there is a method (Related Art 2-1) disclosed in Patent Document 2, for example. In this method, an epoxy resin layer 203 is laminated on a double-sided copper clad with copper circuits 201 provided on a surface thereof, as shown in FIG. 27. Then, via holes 204 are formed by laser processing. A process of activating surfaces of the copper circuits 201 is performed, and an electroless copper plating process is applied, thereby forming electroless copper plating layers 206 on activated regions 205 on the surfaces of the copper circuits 201, respectively. A Pd catalyst 207 is deposited on exposed surfaces of the copper circuits 201 and the epoxy resin layer 203. Then, by applying the electroless plating process, a plated seed layer 208 is formed over the exposed surfaces of the copper circuits 201 and the epoxy resin layer 203. Then, by applying an electrolytic plating process, an electrolytic copper plating layer 209 is formed over the plated seed layer 208, thereby burying the via holes.

Patent Document 2 further presents a build-up multilayer wiring board structure that uses a common filled via (Related Art 2-2). In this method, as shown in FIG. 28, on a double-sided copper clad 225 with copper circuits 221 provided on both surfaces thereof and with a through conductor 222, a power supply layer 223, and a GND layer 224 provided inside thereof, copper wiring layers 227 that form electronic circuit patterns are provided in multiple layers through inter-layer insulating films formed of epoxy resin layers 226. The copper wiring layers 227 of the multiple layers are interconnected by vias 228 of which via holes are buried.

As other method of forming the filled via, there is a method (Related Art 3) disclosed in Patent Document 3, for example. In this method, as shown in FIG. 29, using a step of providing through holes 303 in a compressible porous base material 302 provided with releasing (releasable) films 301, filling a conductive paste 304 into each of the through holes 303, permeating a binder component of the paste into the porous base material 302, thereby increasing a composition ratio of a conductive material to a binder of the paste, and a step of adhering metal foils 305 to surfaces of the base material with the releasing films 301 separated and removed therefrom, for heating and pressurization, and compressing the laminated base material, the conductive material is densified, thereby achieving electrical connection between the metal foils.

Patent Document 1: JP Patent Kokai Publication No. JP-P-2002-26515A (paragraphs [0042] to [0061], FIGS. 1 to 9)
Patent Document 2: JP Patent Publication No. 3596476 (paragraphs [0005], [0058] to [0068], FIGS. 3, 4, and 8)
Patent Document 3: JP Patent Publication No. 2601128 (paragraphs [0018] to [0019], FIG. 1)

DISCLOSURE OF THE INVENTION

Problem to be Solved by the Invention

However, in recent years, ergonomic design targeted for improving outward appearance beauty, operability, and transportability has been demanded for the electronic devices. Thus, there is an increasing demand for improving a degree of freedom with respect to the shape of the printed circuit board, especially for the curved printed circuit board. Accordingly, only with conventional measures toward small geometries and higher reliability of a via structure used for interlayer connection in the multilayer printed circuit board, it is impossible to address a problem of occurrence of an electrical fault such as signal disconnection due to exfoliation between a via and the board or a via crack, caused by various stresses when curving the printed circuit board. Thus, it is difficult to curve the printed circuit board. The various stresses include bending stress, tensile stress, compressive stress, and shear stress that may arise in regions between conductor layers including a via inner wall surface, a region between the via inner wall surface and an electrical insulating base material, a region between a via land and the electrical insulating base material, a region between the via inner wall surface and a via bottom, and a region between the via bottom and a surface circuit.

An object of the present invention has been proposed so as to solve the problem of the Related Arts as described above. It is an object of the present invention is therefore to provide a printed circuit board suitable for being curved and a semiconductor package, in which bending stress, tensile stress, compressive stress, and shear stress that may arise in regions between conductor layers when curving the printed circuit board are reduced, without causing an electrical fault such as signal disconnection due to exfoliation between a via and the board, or a via crack caused by the various stresses. The regions between the conductor layers include a via inner wall surface, a region between the via inner wall surface and an electrical insulating base material, a region between a via land and the electrical insulating base material, a region between the via inner wall surface and a via bottom, and a region between the via bottom and a surface circuit.

Means to Solve the Problems

A printed circuit board according to a first aspect of the present invention includes:

a first wiring layer;

an electrical insulating base material formed on the first wiring layer and having a via base hole that leads to the first wiring layer; and a second wiring layer formed on the electrical insulating base material and electrically connected to the first wiring layer through the via base hole;

a stress relieving portion being formed in a region of the second wiring layer disposed at least in the vicinity of the via base hole, the stress relieving portion relieving bending stress, tensile stress, compressive stress, and shear stress that may arise when the electrical insulating base material is curved.

Preferably, the stress relieving portion in the printed circuit board of the present invention is a blank portion that is formed by removing a part of the second wiring layer disposed at least in the vicinity of the via base hole.

Preferably, in the printed circuit board of the present invention, a material with a lower Young's modulus than a material used for the second wiring layer is buried into at least the blank portion of the stress relieving portion.

Preferably, in the printed circuit board of the present invention, the second wiring layer includes:

a conformal via connecting portion formed with a constant thickness along a surface of the via base hole; and a via land portion disposed around the via base hole.

Preferably, in the printed circuit board of the present invention, the stress relieving portion is formed in one or both of the conformal via connecting portion and the via land portion.

Preferably, in the printed circuit board of the present invention, the stress relieving portion is formed like at least one general polygon corresponding to a bending direction of the electrical insulating base material, as seen from a direction perpendicular to a plane of the electrical insulating base material.

Preferably, in the printed circuit board of the present invention, the stress relieving portion is at least in contact with one or both of surfaces of the via base hole and the electrical insulating base material.

Preferably, in the printed circuit board of the present invention, the stress relieving portion is formed like a mesh.

Preferably, in the printed circuit board of the present invention, the second wiring layer includes:

a filled via connecting portion formed by filling in an inside of the via base hole; and a via land portion disposed around the via base hole.

Preferably, in the printed circuit board of the present invention, the stress relieving portion is formed in at least the filled via connecting portion and is formed to pass through at least a central axis of the filled via connecting portion, as seen from a direction perpendicular to a plane of the electrical insulating base material.

Preferably, in the printed circuit board of the present invention, the stress relieving portion is at least in contact with one or both of surfaces of the via base hole and the first wiring layer.

Preferably, in the printed circuit board of the present invention, the stress relieving portion opens to a surface of the filled via connecting portion.

Preferably, in the printed circuit board of the present invention, the stress relieving portion is sharpened (i.e. reduced in thickness) toward the surface of the filled via connecting portion or the first wiring layer.

In a printed circuit board according to a second aspect of the present invention, the electrical insulating base materials and the second wiring layers are alternately laminated on the first wiring layer; and the respective second wiring layers are electrically connected to one another through the via base holes.

Preferably, in the printed circuit board of the present invention, the via base holes of the electrical insulating base materials are disposed in a stacked position, as seen from a direction perpendicular to a surface of the first wiring layer.

A semiconductor package according to a third aspect of the present invention includes:

a printed circuit board; and a semiconductor chip mounted on the printed circuit board.

Meritorious Effects of the Invention

According to the present invention (claimed in claims 1 through 16), bending stress, tensile stress, compressive stress, and shear stress that may arise in regions between conductor layers when curving the printed circuit board can be relieved. Thus, the printed circuit board can be readily curved without causing an electrical fault such as signal disconnection due to exfoliation between a via and the board or a via crack. The regions between the conductor layers include a via inner wall surface, a region between the via inner wall surface and an electrical insulating base material, a region between a via land and the electrical insulating base material, a region between the via inner wall surface and a via bottom, and a region between the via bottom and a surface circuit.

According to the present invention (claimed in claims 2 and 3), a part of the second wiring layer is deleted, as the stress relieving portion. The stresses that may arise between the conductor layers when curving the printed circuit board can be thereby relieved. The printed circuit board thus can be curved.

BRIEF DESCRIPTION OF THE DRAWINGS

FIGS. 1A to 1C are a partial plan view, a partial sectional view taken along a line A-A', and a partial sectional view taken along a line B-B', respectively, which schematically show a configuration of a printed circuit board (of a conformal via type) according to example 1 of the present invention;

FIG. 3 is a partial plan view schematically showing a configuration of a mask for forming a wiring layer used in the method of manufacturing the printed circuit board (of the conformal via type) according to example 1 of the present invention;

FIGS. 4A and 4B are a partial plan view and a partial sectional view taken along a line C-C', respectively, which schematically show a state where the printed circuit board (of the conformal via type) according to example 1 of the present invention is curved;

FIGS. 5A to 5C are a partial plan view, a partial sectional view taken along a line A-A', and a partial sectional view taken along a line B-B', respectively, which schematically show a configuration of a printed circuit board (of the conformal via type) according to example 2 of the present invention;

FIGS. 6A and 6B are a partial plan view and a partial sectional view taken along a line C-C', respectively, which schematically show a state where the printed circuit board (of the conformal via type) according to example 2 of the present invention is curved;

FIGS. 7A to 7C are a partial plan view, a partial sectional view taken along a line A-A', and a partial sectional view taken along a line B-B', respectively, which schematically show a configuration of a printed circuit board (of the conformal via type) according to example 3 of the present invention;

FIGS. 8A and 8B are a partial plan view and a partial sectional view taken along a line C-C', respectively, which schematically show a state where the printed circuit board (of the conformal via type) according to example 3 of the present invention is curved;

FIGS. 9A to 9C are a partial plan view, a partial sectional view taken along a line A-A', and a partial sectional view taken along a line B-B', respectively, which schematically show a configuration of a printed circuit board (of a filled via type) according to example 4 of the present invention;

FIGS. 12A and 12B are a partial plan view and a partial sectional view taken along a line C-C', respectively, which schematically show a state where the printed circuit board (of the filled via type) according to example 4 of the present invention is curved;

FIGS. 14A to 14C are a partial plan view, a partial sectional view taken along a line A-A', and a partial sectional view taken along a line B-B', respectively, which schematically show a configuration of a printed circuit board (of the filled via type) according to example 5 of the present invention;

FIGS. 15A and 15B are a partial plan view and a partial sectional view taken along a line C-C', respectively, which schematically show a state where the printed circuit board (of the filled via type) according to example 5 of the present invention is curved;

FIGS. 16A to 16C are a partial plan view, a partial sectional view taken along a line A-A', and a partial sectional view taken along a line B-B', respectively, which schematically show a configuration of a printed circuit board (of the filled via type) according to example 6 of the present invention;

FIGS. 18A and 18B are a partial plan view and a partial sectional view taken along a line C-C', respectively, which schematically show a state where the printed circuit board (of the filled via type) according to example 6 of the present invention is curved;

FIGS. 19A to 19C are a partial plan view, a partial sectional view taken along a line A-A', and a partial sectional view taken along a line B-B', respectively, which schematically show a configuration of a printed circuit board (of the filled via type) according to example 7 of the present invention;

FIGS. 20A and 20B are a partial plan view and a partial sectional view taken along a line C-C', respectively, which schematically show a state where the printed circuit board (of the filled via type) according to example 7 of the present invention is curved;

FIGS. 21A to 21C are a partial plan view, a partial sectional view taken along a line A-A', and a partial sectional view taken along a line B-B', respectively, which schematically show a configuration of a printed circuit board (of the filled via type) according to example 8 of the present invention;

FIGS. 22A and 22B are a partial plan view and a partial sectional view taken along a line C-C', respectively, which schematically show a state where the printed circuit board (of the filled via type) according to example 8 of the present invention is curved;

FIGS. 23A to 23C are a partial plan view, a partial sectional view taken along a line A-A', and a partial sectional view taken along a line B-B', respectively, which schematically show a configuration of a printed circuit board (of the filled via type) according to example 9 of the present invention;

FIGS. 24A and 24B are a partial plan view and a partial sectional view taken along a line C-C', respectively, which schematically shows a state where the printed circuit board (of the filled via type) according to example 9 of the present invention is curved;

Figure 2A:
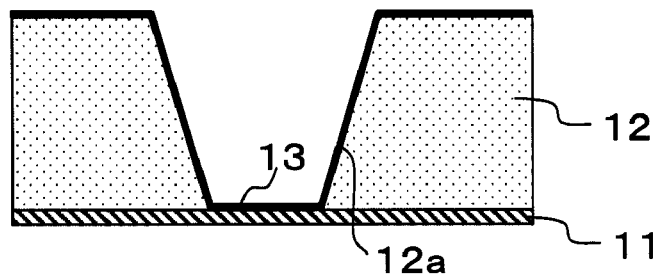
FIG. 2 includes partial sectional views of steps for explaining a method of manufacturing the printed circuit board (of the conformal via type) according to example 1 of the present invention.
Figure 2B:
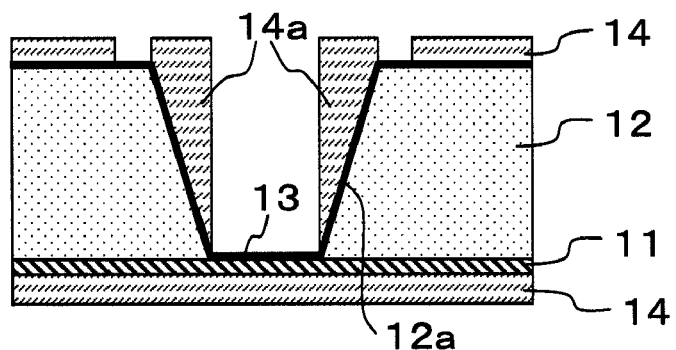

EXPLANATIONS OF SYMBOLS 1 printed circuit (wiring) board
2 semiconductor package
11 metal foil (Cu foil, first wiring layer)
12 electrical insulating base material
12a via base hole
13 electroless Cu layer
14 photoresist layer
14a photoresist layer for stress relieving portion formation
15 mask
15a wiring pattern
15b stress relieving portion pattern
16 wiring layer (electrolytic Cu layer, second wiring layer)
16a conformal via connecting portion
16b via inner wall portion
16c via bottom portion
16d via land portion
16e wiring portion
17 stress relieving portion
26 wiring layer (electrolytic Cu layer)
26a filled via connecting portion
26b via inner wall portion
26c via bottom portion
26d via land portion
26e wiring portion
27 stress relieving spacer
28 adhesive agent layer
30 semiconductor chip (LSI)
31 bonding wire (Au wire)
32 sealing resin (epoxy resin)
101, 102 wiring layer
103 base
104 insulating layer
105 via
106, 107 plating layer
201 copper circuit
202 double-sided copper clad
203 epoxy resin layer
204 via hole
205 activated region
206 electroless copper plating layer
207 Pd catalyst
208 plated seed layer
209 electrolytic copper plating layer
221 copper circuit
222 through conductor
223 power supply layer
224 GND layer
225 double-sided copper clad-laminate
226 epoxy resin layer
227 copper wiring layer
228 via
301 releasing film
302 porous base material
303 through hole
304 conductive paste
305 metal foil

PREFERRED MODES FOR CARRYING OUT THE INVENTION

Example 1

A printed circuit board (of a conformal via type) according to example 1 of the present invention will be described using drawings. FIGS. 1A to 1C are a partial plan view, a partial sectional view taken along a line A-A', and a partial sectional view taken along a line B-B', respectively, which schematically show a configuration of the printed circuit board (of the conformal via type) according to example 1 of the present invention.

A printed circuit board 1 is a printed circuit board of the conformal via type, and includes a metal foil 11, an electrical insulating base material 12, a wiring layer 16, and stress relieving portions 17. The conformal via is generally a via to which metal plating (such as copper plating) simultaneously formed with a wiring portion 16e along a surface of a via base hole is applied, and only a metal plating layer having a same (or constant) thickness as the wiring layer is formed on the via. For this reason, a conductor is not completely filled inside the via.

The metal foil 11 is formed on (attached to) an entire one-side surface (a first surface) of the plate-like electrical insulating base material 12. A Cu foil, for example, may be employed as the metal foil 11. The metal foil 11 on the first surface of the electrical insulating base material 12 covers a via base hole 12a. The metal foil 11 is in close contact with a via bottom portion 16c of the wiring layer 16. Though not illustrated, the metal foil 11 may be formed into a wiring layer with a part of the metal foil 11 left, or all of the metal foil 11 may be removed, by etching.

The electrical insulating base material 12 is a plate-like base material formed of an electrically insulating material. A thermoplastic resin, a thermosetting resin, a liquid crystal polymer, or the like, for example, may be employed for the electrical insulating base material 12. The metal foil 11 is formed (applied) on the entire first surface of the electrical insulating base material 12. At a predetermined position of the electrical insulating base material 12, the via base hole 12a that pierces from a surface (a second surface) on a side of the wiring portion 16e of the wiring layer 16 to the first surface is formed. The via base hole 12a does not pierce the metal foil 11. The wiring layer 16 is formed from the second surface of the electrical insulating base material 12 through predetermined locations of the via base hole 12a.

The wiring layer 16 is a layer of a conductor formed from the second surface of the electrical insulating base material 12 through the predetermined locations of the via base hole 12a, and on a surface of the metal foil 11 that is exposed from the via base hole 12a. Electrolytic Cu plating, for example, may be used for the wiring layer 16. The wiring layer 16 is formed of a conformal via connecting portion 16a, a via land portion 16d and a wiring portion 16e formed integral with one another. The conformal via connecting portion 16a is a portion for via connecting the wiring portion 16e to the metal foil 11 (which is a lower wiring layer) through the via base hole 12a. Only a conductor layer having a same thickness as the wiring portion 16e is formed on respective surfaces of the via base hole 12a and the metal foil 11. The conductor is not completely filled inside the via. The conformal via connecting portion 16a includes a via inner wall portion 16b and the via bottom portion 16c. The via inner wall portion 16b is a portion of the conformal via connecting portion 16a formed on the predetermined location of the surface of the via base hole 12a. The via inner wall portion 16b is not formed on the stress relieving portions 17 of the surface of the via base hole 12a. The via bottom portion 16c is a portion of the conformal via connecting portion 16a formed on the surface of the metal foil 11 within the via base hole 12a. The via land portion 16d is a portion formed on the second surface of the electrical insulating base material 12 and around the via base hole 12a. The wiring portion 16e is formed on a predetermined location of the second surface of the electrical insulating base material 12, and forms a surface layer circuit.

The stress relieving portions 17 are portions that relieve stresses such as bending stress, tensile stress, compressive stress, shear stress, and the like in the vicinity of the via, and are blank portions of the surface of the via base hole 12a, on which the wiring layer 16 (via inner wall portion 16b) is not formed. The stress relieving portions 17 are formed to be shaped as a pair of general squares corresponding to a bending direction of the printed circuit board 1, as seen from a direction perpendicular to a plane.

Next, a method of manufacturing the printed circuit board (of the conformal via type) according to example 1 of the present invention will be described using drawings. FIG. 2 includes partial sectional views of steps for explaining the method of manufacturing the printed circuit board (of the conformal via type) according to example 1 of the present invention. FIG. 3 is a partial plan view schematically showing a configuration of a mask for forming a wiring layer used in the method of manufacturing the printed circuit board (of the conformal via type) according to example 1 of the present invention. FIG. 2 shows a section corresponding to a section taken along the line B-B' in FIG. 1A.

First, the via base hole 12a is formed in the electrical insulating base material 12, to one side surface of which the metal foil 11 has been attached in advance. Then, a solution including a Pd catalyst is adhered to the surface of the electrical insulating base material 12 and an inner wall surface of the via base hole 12a. Then, using an electroless plating method, the Pd catalyst is operated as a catalyst, thereby forming an electroless Cu layer 13 (refer to FIG. 2A). The via base hole 12a may be herein formed using photo etching (lithography), a CO2 laser, a UV-YAG laser, or the like.

Next, a photoresist layer 14 is formed on the electrical insulating base material 12, and exposure and development are performed on the photoresist layer 14 through a mask 15 (refer to FIG. 3; a mask having a wiring pattern 15a with stress relieving portion patterns 15b removed therefrom). Then, a portion of the photoresist layer 14 corresponding to the wiring pattern (indicated by reference numeral 15a in FIG. 3) is removed (refer to FIG. 2B). At this point, photoresist layers 14a for stress relieving portion formation, corresponding to the stress relieving portion patterns 15b, are left.

Figure 2C:
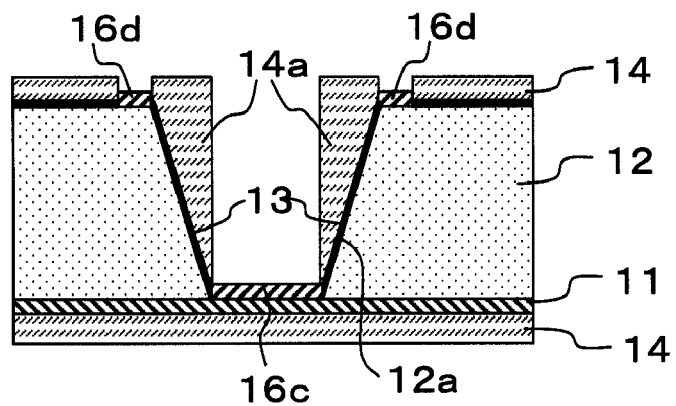

Next, using an electrolytic plating method, the wiring layer 16 (electrolytic Cu layer) is formed (refer to FIG. 2C).

Figure 2D:
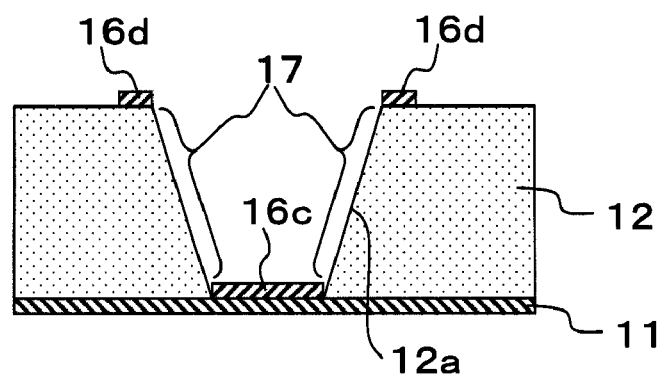

Next, the remaining photoresist layer (indicated by reference numeral 14 in FIG. 2C) and the electroless Cu layer (immediately under the photoresist layer 14) (indicated by reference numeral 13 in FIG. 2C) are removed (in FIG. 2D). This allows formation of the conformal via connecting portion (indicated by reference numeral 16a in FIG. 1) including the stress relieving portions 17 can be formed.

According to example 1, when the printed circuit board 1 is bent with a curvature in a direction generally perpendicular to a direction in which the pair of stress relieving portions 17 is formed, the bending stress, tensile stress, compressive stress, and shear stress that may arise in the via inner wall portion 16b, between the via inner wall portion 16b and the electrical insulating base material 12, between the via land portion 16d and the electrical insulating base material 12, between the via inner wall portion 16b and the via bottom portion 16c, and between the via bottom portion 16c and the metal foil 11 can be relieved. The printed circuit board 1 can be thereby readily curved without causing an electrical fault such as signal disconnection due to exfoliation between the via and the board or a via crack, mainly caused by the various stresses (refer to FIG. 4).

In example 1, each stress relieving portion 17 is formed into the shape of the general square. The shape of the stress relieving portion 17 is not limited to this shape, and a shape of a general (appropriate) polygon such as a general rectangle, a general parallelogram, or a general triangle may be selected as the shape of the stress relieving portion 17. In that case, when the stress relieving portion 17 is formed into the general parallelogram shape, a stress relieving effect on the stress in a shear direction of the via inner wall portion 16b increases. When the stress relieving portion 17 is formed into the general triangle shape, the stress relieving effect on the bending direction, which is an elongating direction of the bottom side of the general triangle, increases. To be more specific, in the case of the general triangle, when the stress relieving portion 17 is so arranged that the via bottom portion 16c is located on a side of the bottom side of the general triangle, an especially large stress relieving effect can be obtained when the printed circuit board 1 is bent into a curved surface so that the surface of the electrical insulating base material 12 in FIG. 1A becomes concave. When the stress relieving portion 17 is so arranged that the via bottom portion 16c is located on a vertex side of the general triangle, an especially large stress relieving effect can be obtained when the printed circuit board 1 is bent into a curved surface so that the surface of the electrical insulating base material 12 in FIG. 1A becomes convex. When the stress relieving portion 17 is shaped to be the general rectangle, general parallelogram, or general triangle, the stress relieving portion 17 may have sides of different length, in view of the bending direction of the printed circuit board 1.

In example 1, the pair of stress relieving portions 17 is formed on opposed regions of the via inner wall portion 16b in the conformal via connecting portion 16a, as seen from the direction perpendicular to the plane of the printed circuit board 1. Arrangement of the pair of stress relieving portions 17 is not limited to this arrangement. By forming four stress relieving portions 17 and providing the four stress relieving portions 17 in regions opposed to one another, respectively, as seen from the direction perpendicular to the plane of the printed circuit board 1, a degree of freedom in curving the printed circuit board 1 can be increased from one degree of freedom to two degrees of freedom. In other words, by forming a plurality of the stress relieving portions 17 and providing the stress relieving portions 17 on opposed regions, respectively, as seen from a main surface of the printed circuit board 1, the degree of freedom in curving the printed circuit board 1 can be arbitrary set.

The bending direction of the printed circuit board 1 is not limited to the direction in which the surface of the printed circuit board 1 on the side of the wiring portion 16e becomes convex, as in FIG. 4B. The printed circuit board 1 may be bent into such a curved surface that the surface on the side of the wiring portion 16e becomes concave or such a curved surface formed by an arbitrary combination of concave and convex surfaces.

With respect to the shape of the stress relieving portion 17 provided at the conformal via connecting portion 16a, when the printed circuit board 1 is formed in a bent shape with a large radius of curvature and a bent shape with a small radius of curvature, for example, the stress relieving portion 17 with the vertex of the general triangle arranged close to the center of bending may be formed on a region with the large radius of curvature, and the stress relieving portion 17 that is the general rectangle or the general parallelogram may be formed on a region with the small radius of curvature. By selecting the shape of the stress relieving portion 17 and arranging the stress relieving portion 17 of the selected shape within the same printed circuit board 1 as necessary according to the bending direction of the printed circuit board 1 and a magnitude of the radius of curvature, the stress relieving effect on various portions of the printed circuit board 1 can be obtained, and the stresses can be relieved in the printed circuit board 1 as a whole.

Herein, two or more of the printed circuit boards 1 may be laminated and may be used as a multilayer printed circuit board. When the lamination is performed, an insulating resin such as an epoxy resin may be filled into a space (including the stress relieving portions 17) inside the conformal via connecting portion 16a. Generally, the Young's modulus of the electrolytic Cu layer is approximately 160 GPa and is larger by approximately 100 times than the Young's modulus of the epoxy resin of 1.5 to 2 GPa. Thus, the stress relieving effect of the present invention is not thereby hindered.

Example 2

A printed circuit board (of the conformal via type) according to example 2 of the present invention will be described using drawings. FIGS. 5A to 5C are a partial plan view, a partial sectional view taken along a line A-A', and a partial sectional view taken along a line B-B', respectively, which schematically show a configuration of the printed circuit board (of the conformal via type) according to example 2 of the present invention. FIGS. 6A and 6B are a partial plan view and a partial sectional view taken along a line C-C', respectively, which schematically show a state where the printed circuit board (of the conformal via type) according to example 2 of the present invention is curved.

The printed circuit board according to example 2 is different from the printed circuit board according to example 1 in that the stress relieving portion 17 is formed in the via land portion 16d as well as the via inner wall portion 16b of the conformal via connecting portion 16a (refer to FIG. 5). The stress relieving portions 17 in example 2 are portions of the via base hole 12a and the surface (second surface) of the electrical insulating base material 12 around the via base hole 12a in which the wiring layer 16 (via inner wall portion 16b) is not formed. The stress relieving portions 17 are formed to be shaped as a pair of general polygons (such as general squares) corresponding to a bending direction of the printed circuit board 1. Other configurations are same as those in example 1. A method of manufacturing the printed circuit board according to example 2 is the same as that in example 1, except for portions associated with the stress relieving portions 17 (the stress relieving portion patterns (indicated by reference numeral 15b in FIG. 3) of the mask and the photoresist layers (indicated by reference numeral 14a in FIG. 2) for stress relieving portion formation).

According to example 2, when the printed circuit board 1 is bent with a curvature in the direction generally perpendicular to the direction in which the pair of stress relieving portions 17 is formed, bending stress, tensile stress, compressive stress, and shear stress that may arise in the via inner wall portion 16b, between the via inner wall portion 16b and the electrical insulating base material 12, between the via land portion 16d and the electrical insulating base material 12, between the via inner wall portion 16b and the via bottom portion 16c, and between the via bottom portion 16c and the metal foil 11 can be relaxed. The printed circuit board 1 can be thereby readily curved without causing the electrical fault such as the signal disconnection due to exfoliation (or peeling off) between the via and the board or a via crack, mainly caused by the various stresses (refer to FIG. 6).

Further, the stress relieving portion 17 is formed in the via land portion 16d as well as the via inner wall portion 16b. Reduction of the stresses between the via land portion 16d and the electrical insulating base material 12 is more effective than in example 1.

Incidentally, in example 2, the stress relieving portion 17 is formed in the via land portion 16d as well as an inner wall surface of the conformal via connecting portion 16a. The stress relieving portion 17 may be formed in the via land portion 16d alone. A structure where the stress relieving portion 17 is formed in the via land portion 16d alone may be applied to where a generated stress is small, as in a case where a curvature at a time of curving the printed circuit board 1 is small.

Example 3

A printed circuit board (of the conformal via type) according to example 3 of the present invention will be described using drawings. FIGS. 7A to 7C are a partial plan view, a partial sectional view taken along a line A-A', and a partial sectional view taken along a line B-B', respectively, which schematically show a configuration of the printed circuit board (of the conformal via type) according to example 3 of the present invention. FIGS. 8A and 8B are a partial plan view and a partial sectional view taken along a line C-C', respectively, which show a state where the printed circuit board (of the conformal via type) according to example 3 of the present invention is curved.

The printed circuit board according to example 3 is different from those in FIGS. 1 and 2 (refer to FIG. 7) in that the stress relieving portion 17 is formed mesh-like (refer to FIG. 7). "Mesh-like" herein refers to a state of the stress relieving portion 17 where the stress relieving portion 17 is divided into a plurality of mesh-like (island-like) portions. The mesh-like stress relieving portion is the one constituted from square stress relieving portions formed like a grid, or circular stress relieving portions arranged in a lattice form, for example. Between the respective stress relieving portions 17, the wiring layer 16 (via inner wall portion 16b) in a mesh form is formed. Other configurations are the same as those in examples 1 and 2. A method of manufacturing the printed circuit board according to example 3 is the same as those in examples 1 and 2, except for portions associated with the stress relieving portions 17 (the stress relieving portion patterns (indicated by reference numeral 15b in FIG. 3) of the mask (indicated by reference numeral 15 in FIG. 3) and the photoresist layers (indicated by reference numeral 14a in FIG. 2) for stress relieving portion formation.

According to example 3, when the printed circuit board 1 is bent with a curvature, bending stress, tensile stress, compressive stress, and shear stress that may arise in the via inner wall portion 16b, between the via inner wall portion 16b and the electrical insulating base material 12, between the via land portion 16d and the electrical insulating base material 12, between the via inner wall portion 16b and the via bottom portion 16c, and between the via bottom portion 16c and the metal foil 11 can be relieved. The printed circuit board 1 can be thereby readily curved without causing the electrical fault such as the signal disconnection due to exfoliation between the via and the board or a via crack, mainly caused by the various stresses (refer to FIG. 8).

Further, the stress relieving portion 17 is mesh-like. Thus, when a bending direction of the printed circuit board 1 is such that the curved surface of the electrical insulating base material 12 shown in FIG. 8A becomes convex as well as concave, or the curved surface of the electrical insulating base material 12 is formed of an arbitrary combination of convex and concave surfaces, a stress relieving effect is increased more than in examples 1 and 2. Further, the stress relieving effect that does not depend on the degree of freedom of the bending direction of the printed circuit board 1 can be obtained by a more simplified structure than in examples 1 and 2.

Example 4

A printed circuit board (of a filled via type) according to example 4 of the present invention will be described using drawings. FIGS. 9A to 9C are a partial plan view, a partial sectional view taken along a line A-A', and a partial sectional view taken along a line B-B', respectively, which schematically show a configuration of the printed circuit board (of the filled via type) according to example 4 of the present invention.

The printed circuit board 1 according to example 4 of the present invention is the printed circuit board of the filled via type. Respective configurations of a wiring layer 26 and the stress relieving portions 17 are different from the wiring layer and the stress relieving portion in examples 1 to 3. Other configurations are the same as those in examples 1 to 3. Generally, a filled via herein refers to a via formed by filling a conductive material into the via base hole 12a, and is a via structure advantageous for being applied to a stack-via structure in which vias are stacked on top of one another.

The wiring layer 26 is a conductor layer formed from the second surface of the electrical insulating base material 12 through the predetermined locations of the via base hole 12a and on the surface of the metal foil 11 that is exposed from the via base hole 12a. A conductive paste or the like, mainly formed of the electrolytic Cu plating, Cu particles, and the epoxy resin or the like, for example, may be used for the wiring layer 26. The wiring layer 26 is formed of a filled via connecting portion 26a, a via land portion 26d, and a wiring portion 26e formed integral with one another. The filled via connecting portion 26a is a portion for via connecting the wiring portion 26e to the metal foil 11 (which is a lower wiring layer) through the via base hole 12a. A conductor is filled inside the via base hole 12a. The conductor is removed from the stress relieving portions 17. The via land portion 26d is a portion formed on the second surface of the electrical insulating base material 12 and around the via base hole 12a. The wiring portion 26e is formed on a predetermined location of the second surface of the electrical insulating base material 12, and forms the surface layer circuit.

The stress relieving portion 17 is the portion that relieves stresses such as the bending stress, tensile stress, compressive stress, shear stress, and the like in the vicinity of the via, and is the portion from which the conductor is removed from predetermined regions on a side of a surface of the filled via connecting portion 26a. The stress relieving portion 17 is formed to be a general rectangle corresponding to a bending direction of the printed circuit board 1, as seen from the direction perpendicular to the plane of the printed circuit board 1. A portion of the via base hole 12a is exposed from each side of the general rectangle in a longitudinal direction thereof, and the bottom of the stress relieving portion 17 is flat.

Next, a method of manufacturing the printed circuit board (of the filled via type) according to example 4 of the present invention will be described using drawings. FIG. 10 includes partial sectional views of steps for explaining the method of manufacturing the printed circuit board (of the filled via type) according to example 4 of the present invention. FIG. 11 is a partial plan view schematically showing a configuration of a mask for forming a wiring layer used in the method of manufacturing the printed circuit board (of the filled via type) according to example 4 of the present invention. FIG. 10 shows a section corresponding to a section taken along the line B-B' in FIG. 9A.

First, the via base hole 12a is formed in the electrical insulating base material 12, to one side surface of which the metal foil 11 has been attached in advance. Then, the solution including the Pd catalyst is adhered to the surface of the electrical insulating base material 12 and the inner wall surface of the via base hole 12a. Then, using the electroless plating method, the Pd catalyst is operated as the catalyst, thereby forming the electroless Cu layer 13 (refer to FIG. 10A). The via base hole 12a may be herein formed using the photo etching, CO2 laser, UV-YAG laser, or the like.

Next, the photoresist layer 14 is formed on the electrical insulating base material 12, and exposure and development are performed on the photoresist layer 14 through a mask 15 (refer to FIG. 11; mask having the wiring pattern 15a). Then, a portion of the photoresist layer 14 corresponding to the wiring pattern (indicated by reference numeral 15a in FIG. 11) is removed (refer to FIG. 10B).

Figure 10A:
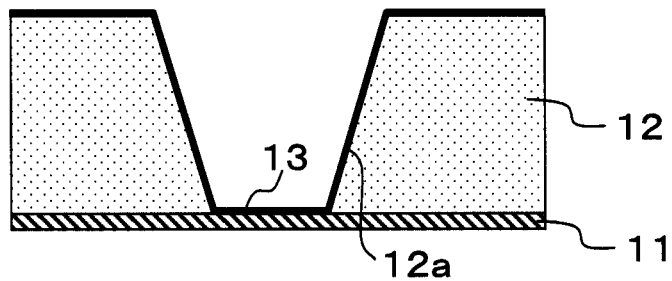
FIG. 10 includes partial sectional views of steps for explaining a method of manufacturing the printed circuit board (of the filled via type) according to example 4 of the present invention.
Figure 10B:
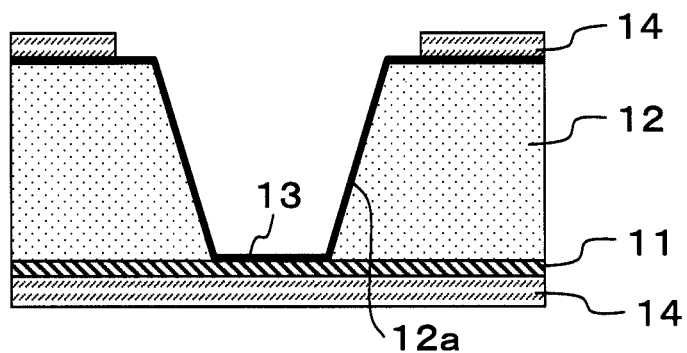
Figure 10C:
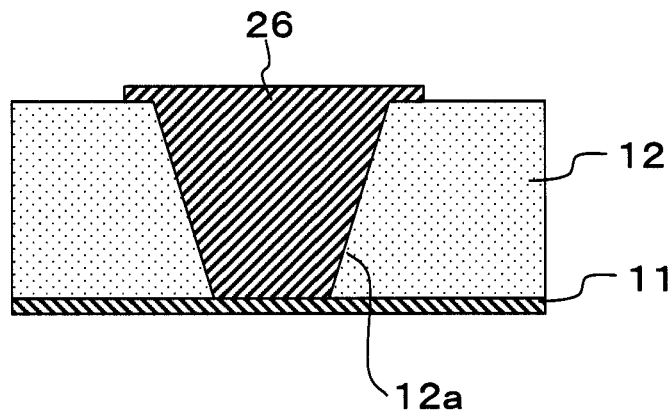
Figure 10D:
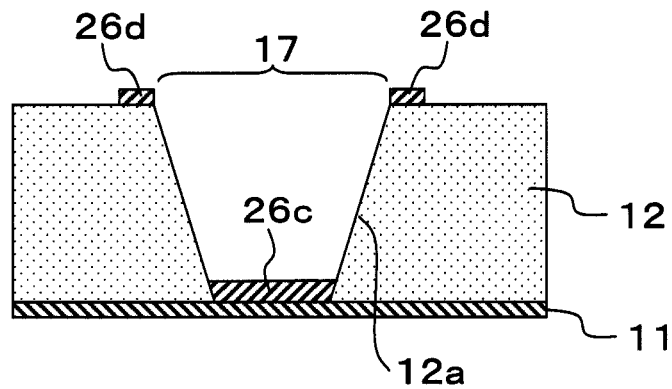
Figure 11:
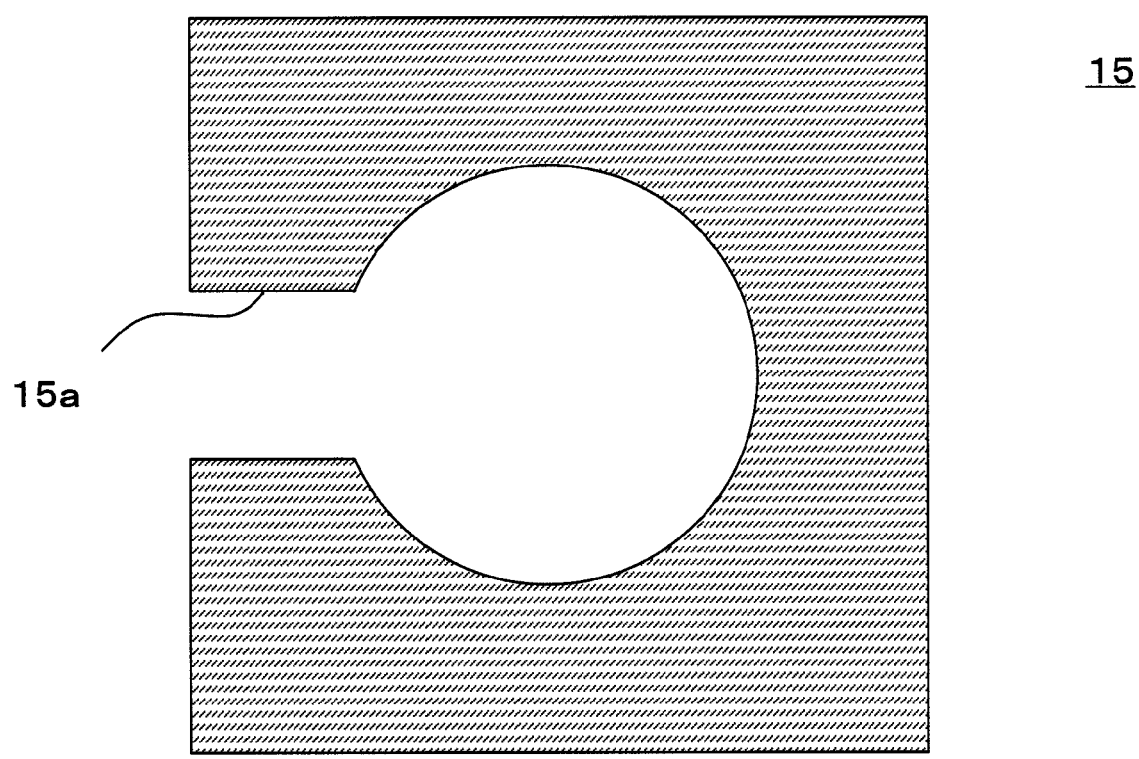
FIG. 11 is a partial plan view schematically showing a configuration of a mask for forming a wiring layer used in the method of manufacturing the printed circuit board (of the filled via type) according to example 4 of the present invention.

Next, using the electrolytic plating method, the wiring layer 26 (electrolytic Cu layer) is formed, and then the remaining photoresist layer (indicated by reference numeral 14 in FIG. 10B) and the electroless Cu layer (immediately under the photoresist layer 14) (indicated by reference numeral 13 in FIG. 10B) are removed (refer to FIG. 10C). In this case, by forming a photoresist layer not shown, performing exposure and development on the photoresist layer through a mask not shown, and applying the electrolytic plating again, the wiring layer 26 is formed up to a thickness where an inside of the via is completely filled in. The filled via connecting portion (indicated by reference numeral 26a in FIG. 9) is thereby formed. Incidentally, in FIG. 10C, an inside of the via base hole 12a is filled in with the electrolytic Cu layer. A conductive paste mainly formed of the Cu particles, epoxy resin, and the like may be filled in.

Next, using means such as photo etching, CO2 laser, UV-YAG laser, or the like, the stress relieving portion 17 is formed in the wiring layer 26.

In example 4, after the stress relieving portion 17 has been formed, the stress relieving portion 17 is left as a space. The space of the stress relieving portion 17 may be filled in with an insulating resin such as the epoxy resin. Generally, the Young's modulus of the electrolytic Cu layer is approximately 160 GPa and is larger by approximately 100 times than the Young's modulus of the epoxy resin of 1.5 to 2 GPa. Thus, the stress relieving effect of the present invention is not thereby adversely affected.

According to example 4, when the printed circuit board 1 is bent with a curvature in a direction generally perpendicular to a longitudinal direction of the stress relieving portion 17, bending stress, tensile stress, compressive stress, and shear stress that may arise in the via inner wall portion 26b, between the via inner wall portion 26b and the electrical insulating base material 12, between the via land portion 26d and the electrical insulating base material 12, between the via inner wall portion 26b and the via bottom portion 26c, and between the via bottom portion 26c and the metal foil 11 can be relieved. Thus, the printed circuit board 1 can be readily curved without causing the electrical fault such as the signal disconnection due to exfoliation between the via and the board or a via crack, mainly caused by the various stresses (refer to FIG. 12).

In example 4, one stress relieving portion 17 is formed in the filled via connecting portion 26a inside the via base hole 12a so that the one stress relieving portion 17 passes through the center of the filled via. Provision of the stress relieving portion is not limited to this manner. By forming two stress relieving portions 17 and providing the two stress relieving portions 17 to cross to each other as seen from the direction perpendicular to the plane of the printed circuit board 1, for example, the degree of freedom in curving the printed circuit board 1 can be increased from one degree of freedom to two degrees of freedom. In other words, by forming a plurality of the stress relieving portions 17 and providing the stress relieving portions 17 to cross to one another, as seen from the direction perpendicular to the plane of the printed circuit board 1, the degree of freedom in curving the printed circuit board 1 can be arbitrarily set.

The bending direction of the printed circuit board 1 is not also limited to the direction in which the surface of the electrical insulating base material 12 in FIG. 12A becomes convex. The printed circuit board 1 may be bent into such a curved shape that the surface of the electrical insulating base material 12 becomes concave or such a curved shape formed by an arbitrary combination of concave and convex surfaces.

Figure 13A:
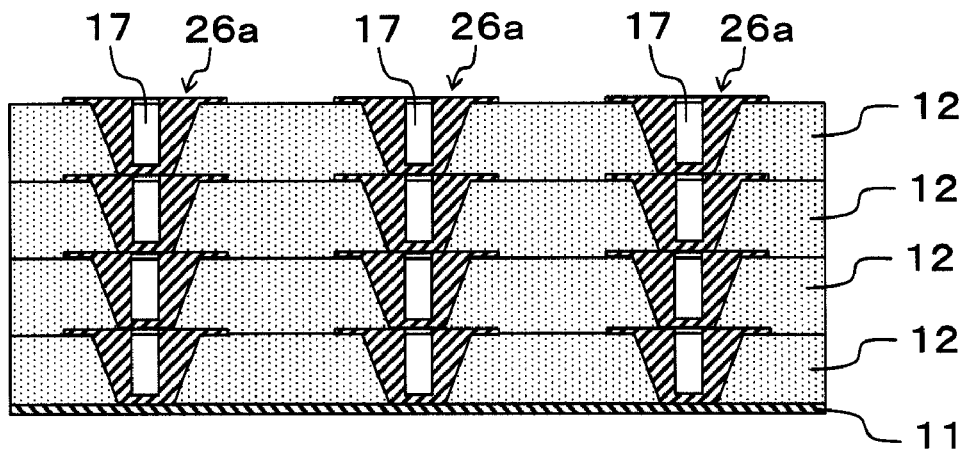
FIGS. 13A and 13B are a sectional view when the printed circuit boards (of the filled via type) according to example 4 of the present invention are laminated as a multilayer printed circuit board and a sectional view when the printed circuit boards according to example 4 are curved, respectively.
Figure 13B:
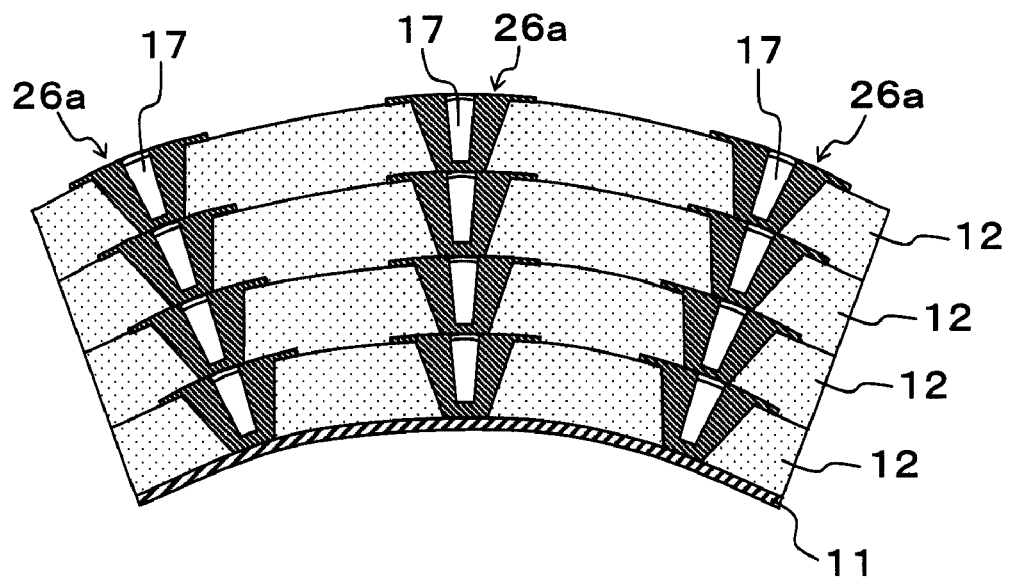

Two or more of the printed circuit boards 1 each having the filled via connecting portion 26a may be laminated, and may be used as a multilayer printed circuit board (refer to FIG. 13). Further, by setting a width of the stress relieving portion 17 in a short side direction thereof (as seen from the direction perpendicular to the plane) to be smaller than a diameter of a bottom surface (surface with the smaller diameter) of the filled via connecting portion 26a, the via of the invention can be applied to the stack of vias in which vias are stacked on top of one another. In that case as well, the stress relieving effect of the present invention can be obtained (refer to FIG. 13).

Example 5

A printed circuit board (of the filled via type) according to example 5 of the present invention will be described using drawings. FIGS. 14A to 14C are a partial plan view, a partial sectional view taken along a line A-A', and a partial sectional view taken along a line B-B', respectively, which schematically show a configuration of the printed circuit board (of the filled via type) according to example 5 of the present invention. FIGS. 15A and 15B are a partial plan view and a partial sectional view taken along a line C-C', which schematically show a state where the printed circuit board (of the filled via type) according to example 5 of the present invention is curved.

In the printed circuit board according to example 5, a shape of the stress relieving portion 17 is different from that in example 4. A surface of the stress relieving portion 17, as seen in the direction perpendicular to the plane of the printed circuit board 1, is formed to be a general rectangle corresponding to a bending direction of the printed circuit board 1. A portion of the via base hole 12a is exposed from each side of the general rectangle in a longitudinal direction thereof, and the bottom of the via base hole 12a is sharpened (or a leading end of the via base hole 12a may be rounded). Other configurations are the same as those in example 4. A method of manufacturing the printed circuit board according to example 5 is the same as that in example 4 except for a portion associated with the shape of the stress relieving portion 17.

According to example 5, when the printed circuit board 1 is bent with a curvature in the direction generally perpendicular to the longitudinal direction of the stress relieving portion 17, bending stress, tensile stress, compressive stress, and shear stress that may arise in the via inner wall portion 26b, between the via inner wall portion 26b and the electrical insulating base material 12, between the via land portion 26d and the electrical insulating base material 12, between the via inner wall portion 26b and the via bottom portion 26c, and between the via bottom portion 26c and the metal foil 11 can be relieved. Thus, the printed circuit board 1 can be thereby readily curved without causing the electrical fault such as the signal disconnection due to exfoliation between the via and the board or a via crack, mainly caused by the various stresses (refer to FIG. 15).

In example 5, especially when the bending direction of the printed circuit board 1 is such that the surface of the electrical insulating base material 12 in FIG. 15A becomes convex, a stress relieving effect increases more than that in example 4.

Example 6

A printed circuit board (of the filled via type) according to example 6 of the present invention will be described using drawings. FIGS. 16A to 16C are a partial plan view, a partial sectional view taken along a line A-A', a partial sectional view taken along a line B-B', respectively, which schematically show a configuration of the printed circuit board (of the filled via type) according to example 6 of the present invention.

The printed circuit board 1 according to example 6 of the present invention is a printed circuit board of the filled via type. The printed circuit board according to example 6 is different from those in examples 4 and 5 in a configuration of the wiring layer 26 and in that a stress relieving spacer 27 is buried as the stress relieving portion. Other configurations are the same as those in examples 4 and 5.

The wiring layer 26 is a conductor layer formed from the second surface of the electrical insulating base material 12 through the predetermined location of the via base hole 12a, and on the surface of the metal foil 11 that is exposed from the via base hole 12a. The conductive paste or the like, mainly formed of the electrolytic Cu plating, Cu particles, and epoxy resin or the like, for example, may be used for the wiring layer 26. The wiring layer 26 is formed of the filled via connecting portion 26a, via land portion 26d, and the wiring portion 26e formed integral with one another. The filled via connecting portion 26a is a portion for via connecting the wiring portion 26e to the metal foil 11 (which is a lower wiring layer) through the via base hole 12a. The conductor is filled inside the via base hole 12a, except for a portion where the stress relieving spacer 27 is disposed. The via land portion 26d is a portion formed on the second surface of the electrical insulating base material 12 and around the via base hole 12a. The wiring portion 26e is formed on the predetermined location of the second surface of the electrical insulating base material 12, and forms the surface layer circuit.

The stress relieving spacer 27 is a portion that relieves stresses such as a bending stress, tensile stress, compressive stress, shear stress, and the like in the vicinity of the via, and is the portion disposed on a predetermined position on a side of a bottom surface of the filled via connecting portion 26a. The stress relieving spacer 27 is disposed on the metal foil 11 within the via base hole 12a. A bottom portion of the stress relieving spacer 27 is a flat surface in contact with the metal foil 11. A leading end of the stress relieving spacer 27 is sharpened (or the leading end may be rounded), is not seen from the surface of the printed circuit board 1, and is in a condition of being buried in the filled via connecting portion 26a. The stress relieving spacer 27 is disposed so that an edge line of the leading end of the stress relieving spacer 27 corresponds to a bending direction of the printed circuit board 1. The epoxy resin or the like, for example, may be employed for the stress relieving spacer 27.

Next, a method of manufacturing the printed circuit board (of the filled via type) according to example 6 of the present invention will be described using drawings. FIG. 17 includes partial sectional views of steps for explaining the method of manufacturing the printed circuit board (of the filled via type) according to example 6 of the present invention. FIG. 17 shows a section corresponding to a section taken along the line B-B' in FIG. 16A.

First, the stress relieving spacer 27 is formed on the metal foil 11 by an electroplating (or deposition) method. On the other hand, the via base hole 12a is formed in the electrical insulating base material 12, and an adhesive agent layer 28 is formed on a bottom surface of the electrical insulating base material 12. Then, the stress relieving spacer 27 is inserted into the via base hole 12a, and the electrical insulating base material 12 and the metal foil 11 are adhered together through the adhesive agent layer 28 (refer to FIG. 17A).

Next, a solution including a Pd catalyst is adhered to the surface of the electrical insulating base material 12, inner wall surface of the via base hole 12a, and a surface of the stress relieving spacer 27. Then, using the electroless plating method, the Pd catalyst is operated as the catalyst, thereby forming the electroless Cu layer 13. Then, the photoresist layer 14 is formed on the electrical insulating base material 12, and exposure and development are performed on the photoresist layer 14 via a mask 15 (refer to FIG. 11; mask having the wiring pattern 15a). A portion of the photoresist layer 14 corresponding to the wiring pattern (indicated by reference numeral 15a in FIG. 11) is removed (refer to FIG. 17B).

Figure 17A:
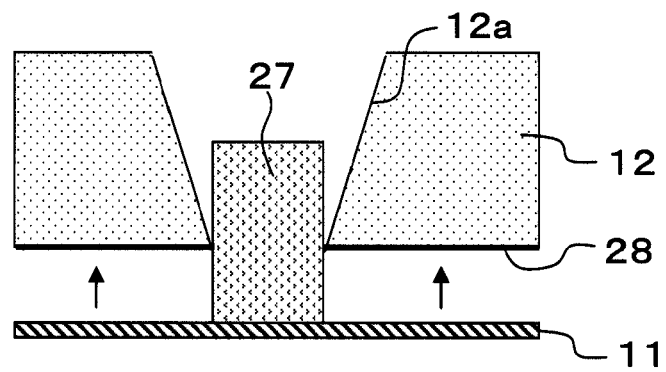
FIG. 17 includes partial sectional views of steps for explaining a method of manufacturing the printed circuit board (of the filled via type) according to example 6 of the present invention.
Figure 17B:
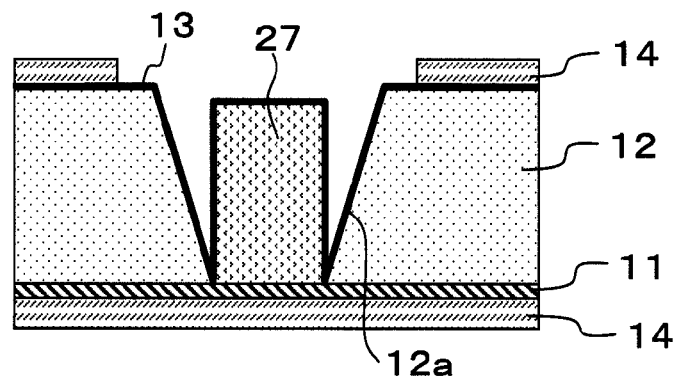
Figure 17C:
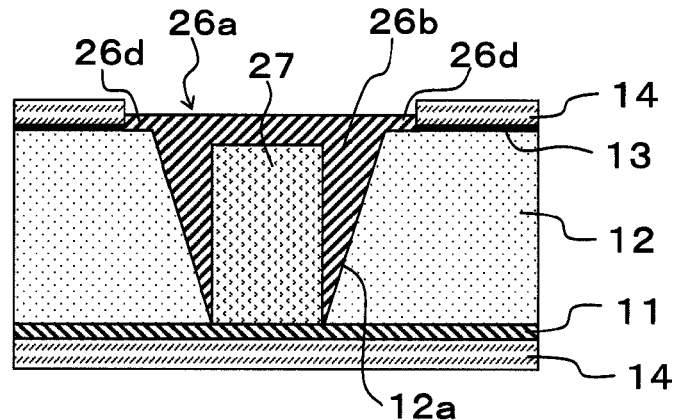

Next, using the electrolytic plating method, a wiring layer 26 (electrolytic Cu layer) is formed (refer to FIG. 17C). In this case, by forming a photoresist layer not shown, performing exposure and development on the photoresist layer through a mask not shown, and applying electrolytic plating again, the wiring layer 26 is formed up to a thickness where the inside of the via is completely filled in. The filled via connecting portion 26a is thereby formed. In FIG. 17C, the inside of the via base hole 12a is filled with the electrolytic Cu layer. The conductive paste mainly formed of the Cu particles, epoxy resin, or the like, however, may be filled.

Figure 17D:
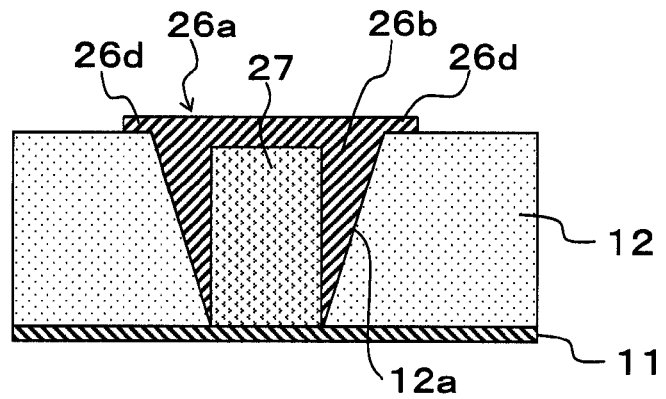

Next, the remaining photoresist layer (indicated by reference numeral 14 in FIG. 17C) and the electroless Cu layer (indicated by reference numeral 13 in FIG. 17C) (immediately under the photoresist layer 14) are removed (refer to FIG. 17D).

According to example 6, when the printed circuit board 1 is bent with a curvature in a direction generally perpendicular to the edge line direction of a vertex of the stress relieving spacer 27, bending stress, tensile stress, compressive stress, and shear stress that may arise in the via inner wall portion 26b, between the via inner wall portion 26b and the electrical insulating base material 12, between the via land portion 26d and the electrical insulating base material 12, between the via inner wall portion 26b and the via bottom portion 26c, and between the via bottom portion 26c and the metal foil 11 can be relieved. The printed circuit board 1 can be thereby readily curved without causing the electrical fault such as the signal disconnection due to exfoliation between the via and the board or a via crack, mainly caused by the various stresses (refer to FIG. 18). Especially when the bending direction of the printed circuit board 1 is such that the surface of the electrical insulating base material 12 becomes concave, a stress relieving effect increases more than in examples 4 and 5.

In example 6, two or more of the printed circuit boards 1 may be laminated for use as the multilayer printed circuit board, as in FIG. 13 in example 4. This does not hinder the stress relieving effect of the present invention. The via of the present invention can be applied to the stack via in which vias are stacked on top of one another, and in this case as well, the stress relieving effect of the present invention can be obtained.

Further, the bending direction of the printed circuit board 1 is not limited to the direction in which the curved surface of the electrical insulating base material 12 becomes convex, as shown in FIG. 18B. The curved surface of the printed circuit board 1 such that the surface of the electrical insulating base material 12 becomes concave or an arbitrary combination of concave and convex surfaces may be formed.

Example 7

A printed circuit board (of the filled via type) according to example 7 of the present invention will be described using drawings. FIGS. 19A to 19C are a partial plan view, a partial sectional view taken along a line A-A', and a partial sectional view taken along a line B-B', respectively, which schematically show a configuration of the printed circuit board (of the filled via type) according to example 7 of the present invention. FIGS. 20A and 20B are a partial plan view and a partial sectional view taken along a line C-C', respectively, which schematically show a state where the printed circuit board (of the filled via type) according to example 7 of the present invention is curved.

A shape of the stress relieving portion 17 of the printed circuit board according to example 7 is different from those in examples 4 and 5. The stress relieving portion 17 is formed like a cylinder that extends from the surface of the filled via connecting portion 26a to the surface of the metal foil 11 so that the stress relieving portion 17 passes through the central axis of the filed via. Other configurations are the same as those in examples 4 and 5. A method of manufacturing the printed circuit board according to example 7 is the same as those in examples 4 and 5 except for a portion associated with the shape of the stress relieving portion 17.

According to example 7, when the printed circuit board 1 is bent with a curvature, bending stress, tensile stress, compressive stress, and shear stress that may arise in the via inner wall portion 26b, between the via inner wall portion 26b and the electrical insulating base material 12, between the via land portion 26d and the electrical insulating base material 12, between the via inner wall portion 26b and the via bottom portion 26c, and between the via bottom portion 26c and the metal foil 11 can be relieved. Thus, the printed circuit board 1 can be thereby readily curved without causing the electrical fault such as the signal disconnection due to exfoliation between the via and the board or a via crack, mainly caused by the various stresses (refer to FIG. 20).

The cylindrical stress relieving portion 17 is formed to pass through the central axis of the filled via. Thus, without forming a plurality of the stress relieving portions 17, a stress relieving effect that does not depend on the degree of freedom in a bending direction of the printed circuit board 1 can be obtained with a more simplified structure than in examples 4 to 6.

In example 7, two or more of the printed circuit boards 1 may be laminated for use as the multilayer printed circuit board, as in FIG. 13 in example 4. This does not hinder the stress relieving effect of the present invention. The via of the present invention can be applied to the stack of vias in which vias are stacked on top of one another, and in that case as well, the stress relieving effect of the present invention can be obtained.

The bending direction of the printed circuit board 1 is not limited to the direction in which the surface of the electrical insulating base material 12 becomes convex, as shown in FIG. 20A. The curved surface of the printed circuit board 1 such that the surface of the electrical insulating base material 12 becomes concave or an arbitrary combination of concave and convex surfaces may be formed.

Example 8

A printed circuit board (of the filled via type) according to example 8 of the present invention will be described using drawings. FIGS. 21A to 21C are a partial plan view, a partial sectional view taken along a line A-A', and a partial sectional view taken along a line B-B', respectively, which schematically show a configuration of the printed circuit board (of the filled via type) according to example 8 of the present invention. FIGS. 22A and 22B are a partial plan view and a partial sectional view taken along a line C-C', respectively, which schematically show a state where the printed circuit board (of the filled via type) according to example 8 of the present invention is curved.

A shape of the stress relieving portion 17 of the printed circuit board according to example 8 is different from that in example 4. The stress relieving portion 17 is formed like a cone of which a leading end is directed toward the metal foil 11 (or of which the leading end may be rounded) so that the stress relieving portion 17 passes through the central axis of the filled via in the filled via connecting portion 26a. It does not matter whether a leading end portion of the stress relieving portion 17 (on a side of the metal foil 11) reaches the metal foil or not. Other configurations are the same as those in examples 4 and 5. A method of manufacturing the printed circuit board according to example 8 is the same as that in example 4, except for a portion associated with the shape of the stress relieving portion 17.

According to example 8, when the printed circuit board 1 is bent with a curvature, bending stress, tensile stress, compressive stress, and shear stress that may arise in the via inner wall portion 26b, between the via inner wall portion 26b and the electrical insulating base material 12, between the via land portion 26d and the electrical insulating base material 12, between the via inner wall portion 26b and the via bottom portion 26c, and between the via bottom portion 26c and the metal foil 11 can be relieved. Thus, the printed circuit board 1 can be thereby readily curved without causing the electrical fault such as the signal disconnection due to exfoliation between the via and the board or a via crack, mainly caused by the various stresses (refer to FIG. 22).

Further, the cone-like stress relieving portion 17 is formed to pass through the central axis of the filled via. Thus, a stress relieving effect that does not depend on the degree of freedom in a bending direction of the printed circuit board 1 can be obtained, with a more simplified structure than in examples 4 to 6, without forming a plurality of the stress relieving portions 17. Especially when the bending direction of the printed circuit board 1 is such that the surface of the electrical insulating base material 12 becomes convex, as shown in FIG. 22A, the stress relieving effect increases more than that in example 7.

Example 9

A printed circuit board (of the filled via type) according to example 9 of the present invention will be described using drawings. FIGS. 23A to 23C are a partial plan view, a partial sectional view taken along a line A-A', and a partial sectional view taken along a line B-B', respectively, which schematically show a configuration of the printed circuit board (of the filled via type) according to example 9 of the present invention. FIGS. 24A and 24B are a partial plan view and a partial sectional view taken along a line C-C', respectively, which schematically show a state where the printed circuit board (of the filled via type) according to example 9 of the present invention is curved.

A shape of the stress relieving spacer 27 of the printed circuit board according to example 9 is different from that in example 6. The stress relieving spacer 27 is disposed on the metal foil 11 within the via base hole 12a. The stress relieving spacer 27 is formed like a cone of which a leading end is directed toward the surface of the filled via connecting portion 26a (or of which the leading end may be rounded) so that the stress relieving spacer 27 passes through the central axis of the filled via. The stress relieving spacer 27 is not seen from the surface of the printed circuit board 1 and is in a condition of being buried in the filled via connecting portion 26a. The epoxy resin or the like, for example, may be employed for the stress relieving spacer 27. It does not matter whether a leading end portion of the stress relieving spacer 27 (on a side of the surface of the filled via connecting portion 26a) reaches the surface of the filled via connecting portion 26 or not. Other configurations are the same as those in example 6. A method of manufacturing the printed circuit board according to example 9 is the same as that in example 6.

According to example 9, when the printed circuit board 1 is bent with a curvature, bending stress, tensile stress, compressive stress, and shear stress that may arise in the via inner wall portion 26b, between the via inner wall portion 26b and the electrical insulating base material 12, between the via land portion 26d and the electrical insulating base material 12, between the via inner wall portion 26b and the via bottom portion 26c, and between the via bottom portion 26c and the metal foil 11 can be relieved. The printed circuit board 1 can be thereby readily curved without causing the electrical fault such as the signal disconnection due to exfoliation between the via and the board or a via crack, mainly caused by the various stresses (refer to FIG. 24).

Further, the cone-like stress relieving spacer 27 is formed to pass through the central axis of the filled via. Thus, a stress relieving effect that does not depend on the degree of freedom in a bending direction of the printed circuit board 1 can be obtained, with a more simplified structure than in examples 4 to 6, without forming a plurality of the stress relieving spaces 27. Especially when the bending direction of the printed circuit board 1 is such that the surface of the electrical insulating base material 12 as shown in FIG. 24A, becomes convex, the stress relieving effect increases more than that in examples 7 and 8.

Example 10

Figure 25:
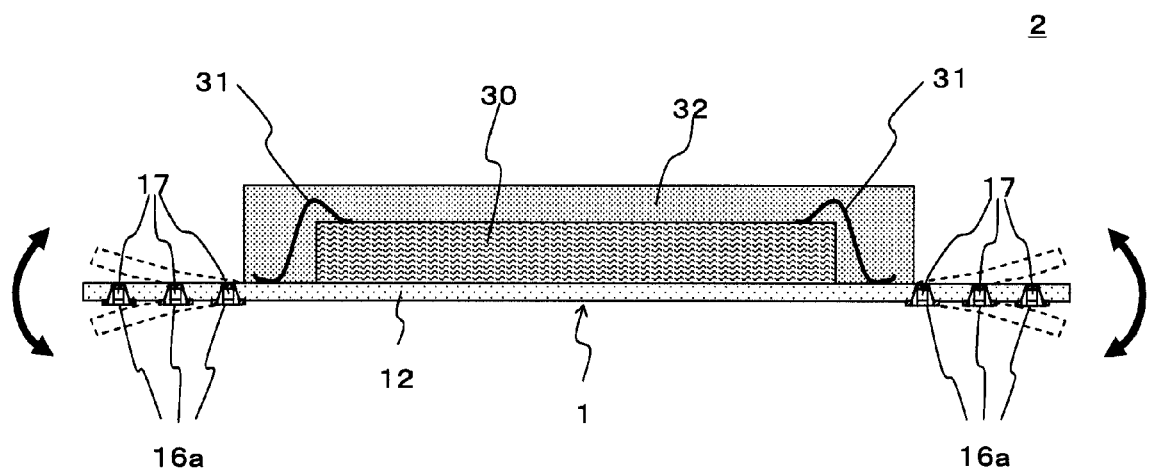
FIG. 25 is a sectional view schematically showing a configuration of a semiconductor package according to example 10 of the present invention.
Figure 26:
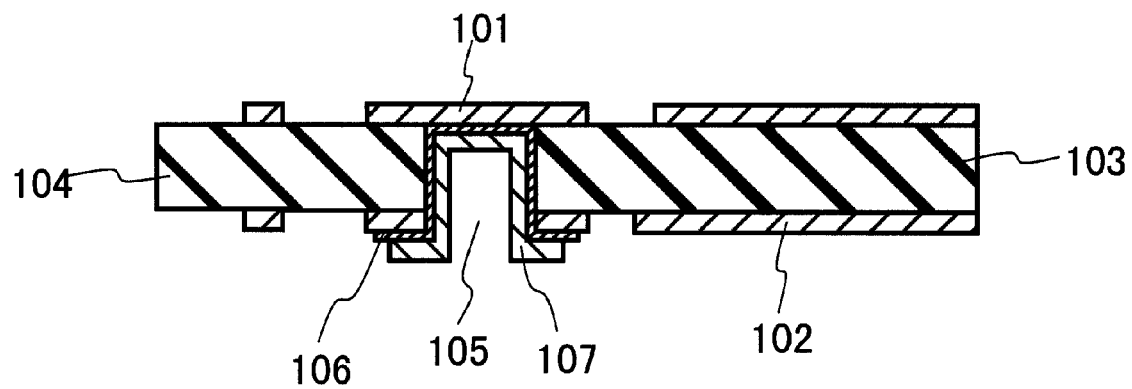
FIG. 26 is a sectional view schematically showing a configuration of a printed circuit board (of the conformal via type) according to Related Art 1 (disclosed in Patent Document 1)
Figure 27A:
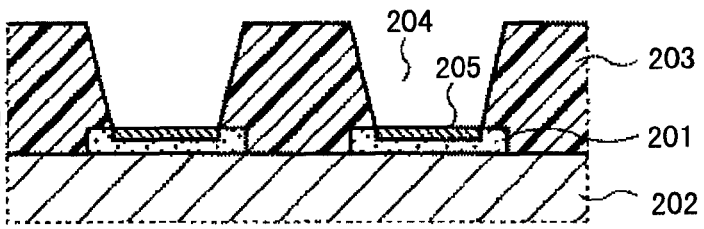
FIG. 27 includes partial sectional views of steps for explaining a method of manufacturing a printed circuit board (of the filled via type) according to Related Art 2-1 (disclosed in Patent Document 2)
Figure 27B:
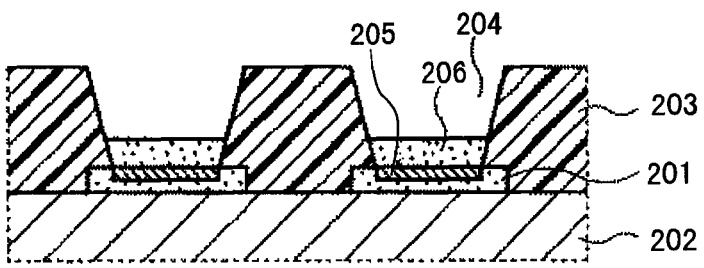
Figure 27C:
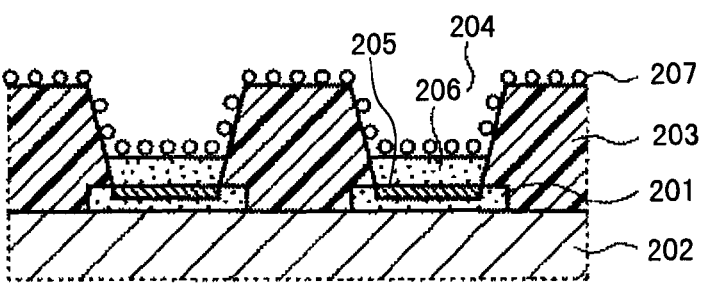
Figure 27D:
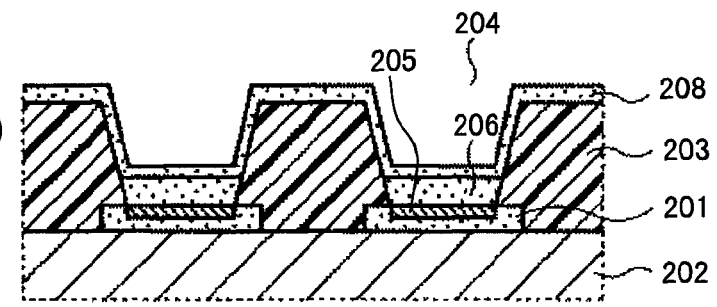
Figure 27E:
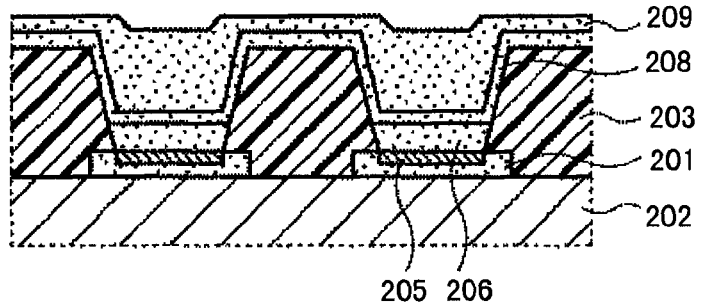
Figure 28:
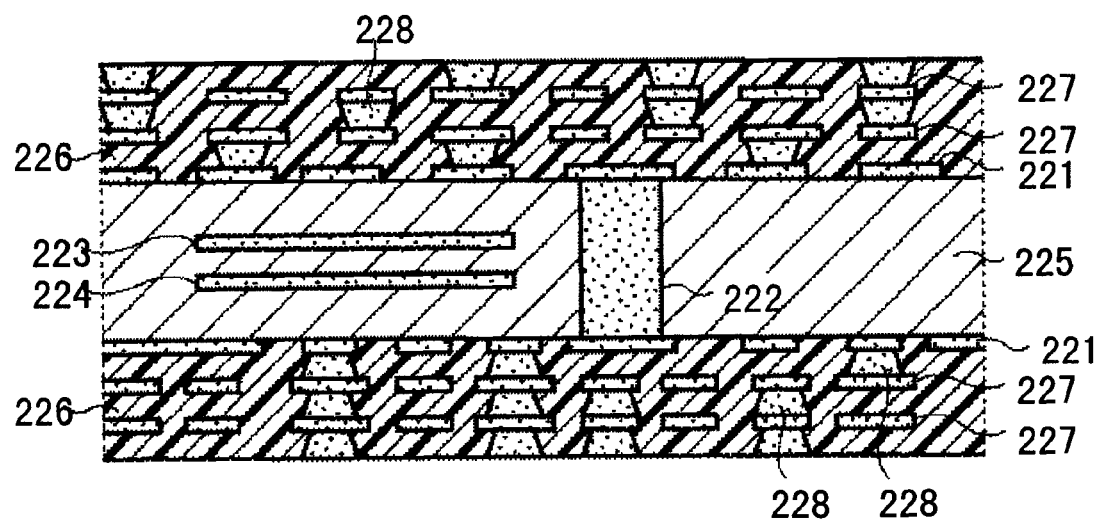
FIG. 28 is a sectional view schematically showing a configuration of a multilayer wiring board obtained by lamination of printed circuit boards (of the filled via type) according to Related Art 2-2 (disclosed in Patent Document 2)
Figure 29A:
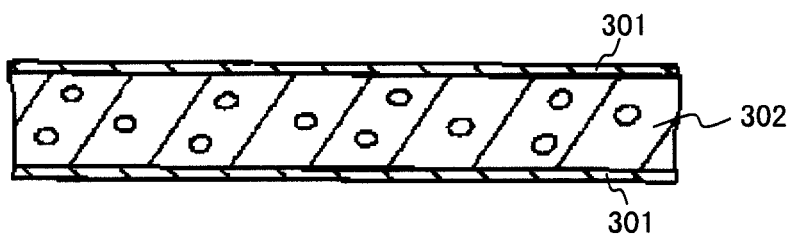
FIG. 29 includes partial sectional views of steps for explaining a method of manufacturing a printed circuit board (of the filled via type) according to Related Art 3 (disclosed in Patent Document 3).
Figure 29B:
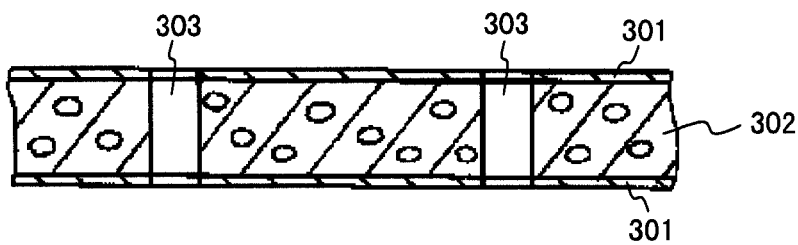
Figure 29C:
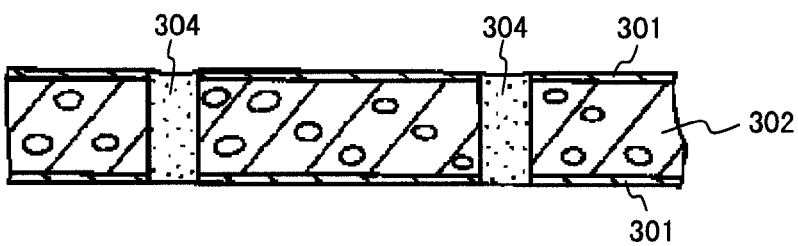
Figure 29D:
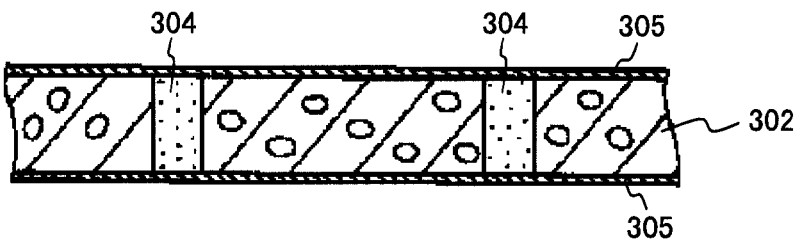
Figure 29E:
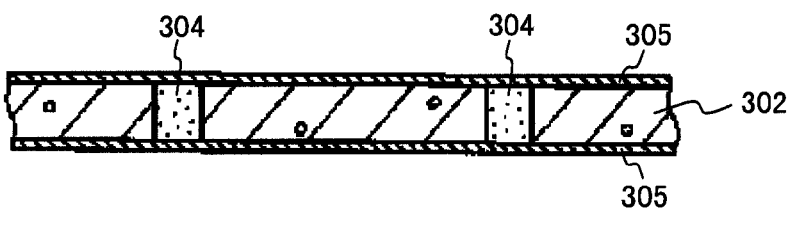

A semiconductor package according to example 10 of the present invention will be described using drawings. FIG. 25 is a sectional view schematically showing a configuration of the semiconductor package according to example 10 of the present invention. In example 10, a description will be given, using the semiconductor package that employs the printed circuit board (of the conformal via type) according to example 1 as an example. The printed circuit board 1 in FIG. 25 corresponds to a section of the printed circuit board 1 taken along the line B-B' in FIG. 1.

In a semiconductor package 2, a semiconductor chip 30 (such as an LSI (large-scale integrated circuit)) is mounted on the printed circuit board 1 (which is comparable to that in FIG. 1). Then, (terminals of) the semiconductor chip 30 and (terminals of) the printed circuit board 1 are electrically connected by bonding wires 31, respectively. The semiconductor package 2 is sealed using a sealing resin 32 so that the sealing resin 32 covers the semiconductor chip 30 and the bonding wires 31. The conformal via connecting portion 16a of the printed circuit board 1 is electrically connected to the corresponding bonding wire 31 through a wiring layer not shown. Incidentally, in the semiconductor package 2, the semiconductor chip 30 and the printed circuit board 1 may be electrically connected through bumps (not shown) without using the bonding wires 31.

According to example 10, the stress relieving portion 17 is formed in the conformal via connecting portion 16a. Thus, even if the printed circuit board 1 is deformed in each arrow direction in FIG. 25 with deformation of a mounting board (not shown) when the semiconductor package 2 and the mounting board (not shown) are electrically and mechanically connected, the electrical fault such as the signal disconnection due to exfoliation between the via and the board or a via crack, mainly caused by bending stress, tensile stress, compressive stress, and shear stress will not be caused. The bending stress, tensile stress, compressive stress, and shear stress may arise in the via inner wall portion, between the via inner wall portion and the electrical insulating base material, between the via land portion and the electrical insulating base material, between the via inner wall portion and the via bottom portion, and between the via bottom portion and the wiring layer.

In example 10, the printed circuit board 1 according to example 1 is used as an example. The printed circuit board 1 is not limited to this printed circuit board. Even when one of the printed circuit boards in examples 2 to 9 is selected, an effect similar to that in example 1 can be obtained.

The invention claimed is:

1. A printed circuit board comprising:
a first wiring layer;
an electrical insulating base material formed on said first wiring layer and including a via base hole that leads to said first wiring layer;
a conductor formed at said via base hole;
a second wiring layer formed on said electrical insulating base material and electrically connected to said first wiring layer through said conductor; and
a stress relieving portion formed in one or both of a region of said second wiring layer at least in the vicinity of said via base hole and a region of said conductor;
wherein said stress relieving portion comprises at least one opening formed through at least one of said second wiring layer and said conductor, through which said electrical insulating base material is exposed; and
wherein said second wiring layer is integrally formed with said conductor.

2. The printed circuit board according to claim 1, wherein said second wiring layer includes:
a via land portion disposed around said via base hole; and
said conductor is a conformal via connecting portion formed with a constant thickness along a surface of said via base hole.

3. The printed circuit board according to claim 2, wherein said stress relieving portion is formed in one or both of said conformal via connecting portion and said via land portion.

4. The printed circuit board according to claim 3, wherein said stress relieving portion is formed as at least one general polygon corresponding to a bending direction of said electrical insulating base material, as seen from a direction perpendicular to a plane of said electrical insulating base material.

5. The printed circuit board according to claim 3, wherein said stress relieving portion is at least in contact with one or both of surfaces of said via base hole and said electrical insulating base material.

6. The printed circuit board according to claim 1, wherein said second wiring layer includes:
a via land portion disposed around said via base hole; and
said conductor is a filled via connecting portion formed by filling in an inside of said via base hole.

7. The printed circuit board according to claim 6, wherein said stress relieving portion is formed in at least said filled via connecting portion and said at least one opening is formed to pass through at least a central axis of said filled via connecting portion, as seen from a direction perpendicular to a plane of said electrical insulating base material.

8. The printed circuit board according to claim 6, wherein said stress relieving portion is at least in contact with one or both of surfaces of said via base hole and said first wiring layer.

9. The printed circuit board according to claim 6, wherein said at lease one opening of said stress relieving portion opens to a surface of said filled via connecting portion.

10. The printed circuit board according to claim 6, wherein a width of said at least one opening of said stress relieving portion narrows toward said surface of said filled via connecting portion or said first wiring layer.

11. The printed circuit board according to claim 1, wherein said electrical insulating base material and said second wiring layer comprise a plurality of electrical insulating base materials and a plurality of second wiring layers alternately laminated on said first wiring layer; and
said plurality of second wiring layers are electrically connected to each other through said conductor.

12. The printed circuit board according to claim 11, wherein said via base hole comprises a plurality of via base holes disposed in a stacked position, as seen from a direction perpendicular to a surface of said first wiring layer.

13. The printed circuit board according to claim 1, wherein said second wiring layer, said conductor, and said opening are formed simultaneously.

14. A semiconductor package comprising:
the printed circuit board according to claim 1; and
a semiconductor chip mounted on the printed circuit board.

15. The printed circuit board according to claim 1, wherein said conductor and said second wiring layer are in contact with said electrical insulating base material.

16. A printed circuit board comprising:
an electrical insulating base material, a wiring layer on an upper surface of said electrical insulating base material, and a wiring layer on a lower surface of said electrical insulating base material;
a conductor disposed in a hole in said electrical insulating base material, said conductor electrically connecting said wiring layer on said upper surface and said wiring layer on said lower surface; and
a stress relieving portion disposed in a part of said conductor;
wherein said stress relieving portion comprises at least one opening formed through at least one of said wiring layer on said upper surface, said wiring layer on said lower surface, and said conductor, through which said electrical insulating base material is exposed; and
wherein said wiring layer on said upper surface is integrally formed with said conductor.

17. The printed circuit board according to claim 16, wherein said wiring layer on said upper surface, said wiring layer on said lower surface, and said conductor are in contact with said electrical insulating base material.

* * * * *